United States Patent
Koyama et al.

(10) Patent No.: US 6,512,250 B1
(45) Date of Patent: Jan. 28, 2003

(54) LIGHT-EMITTING DEVICE

(75) Inventors: Tomoko Koyama, Suwa (JP); Takeo Kaneko, Misato-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/762,614

(22) PCT Filed: Jun. 9, 2000

(86) PCT No.: PCT/JP00/03754

§ 371 (c)(1),
(2), (4) Date: Feb. 9, 2001

(87) PCT Pub. No.: WO00/78102

PCT Pub. Date: Dec. 21, 2000

(30) Foreign Application Priority Data

Jun. 10, 1999 (JP) ............................................. 11-164152
Jun. 10, 1999 (JP) ............................................. 11-164153

(51) Int. Cl.[7] .............................................. H01L 33/00
(52) U.S. Cl. ............................. 257/98; 257/40; 438/69; 438/82; 438/87; 438/88; 438/99; 313/504; 313/505; 313/506; 313/509
(58) Field of Search ........................ 257/48, 40; 438/69, 438/82, 87, 88, 99; 313/504–509

(56) References Cited

U.S. PATENT DOCUMENTS

| | | | | |
|---|---|---|---|---|
| 5,925,980 A | * | 7/1999 | So et al. ..................... | 313/504 |
| 5,994,836 A | * | 11/1999 | Boer et al. .................. | 313/504 |
| 6,069,443 A | * | 5/2000 | Jones et al. ................. | 313/504 |
| 6,222,315 B1 | * | 4/2001 | Yoshizawa et al. ......... | 313/509 |

FOREIGN PATENT DOCUMENTS

| | | |
|---|---|---|
| JP | 63175860 | 7/1988 |
| JP | 1221741 | 9/1989 |
| JP | 2051101 | 2/1990 |
| JP | 2135359 | 5/1990 |
| JP | 2135361 | 5/1990 |
| JP | 3152184 | 6/1991 |

(List continued on next page.)

OTHER PUBLICATIONS

U.S. patent application Ser. No. 09/531,330 (Dckt No. 105018), Koyama et al., filed Mar. 20, 2000.
U.S. patent application Ser. No. 09/920,755 (Dctk No. 110321), Koyama et al., filed Aug. 3, 2001.
U.S. patent application Ser. No. 09/795,435 (Dckt No. 108735), Koyama et al., filed Mar. 1, 2001.
U.S. patent application Ser. No. 09/869,157 (Dckt No. 109926), Koyama et al., filed Jun. 25, 2001.
U.S. patent application Ser. No. 09/878,994 (Dckt No. 109796), Koyama et al., Jun. 13, 2001.

*Primary Examiner*—Nathan J. Flynn
*Assistant Examiner*—Remmon R. Fordé
(74) *Attorney, Agent, or Firm*—Oliff & Berridge, PLC

(57) ABSTRACT

A light-emitting device (1000) has a light-emitting device section (100) and a waveguide section (200) for transmitting light emitted from the light-emitting device section, which are integrally formed on a substrate (10). The light-emitting device section (100) has a transparent anode (200) which is formed on the substrate (10) and forms a light-transmitting section, a grating which is formed in part of the anode (20), an insulation layer (16) having an opening (16*a*) facing the grating (12), a light-emitting layer (14) at least part of which is formed in the opening (16*a*) of the insulation layer (16), and a cathode (22). A waveguide section (200) has a core layer (30) which is formed on the substrate (10) and is integrally formed with the anode (20), and a cladding layer (32) which covers an exposed area of the core layer (30) and is integrally formed with the insulation layer (16). The light-emitting layer can emit light excelling in wavelength selectivity and having directivity, and can be applied to not only displays but also optical communications and the like.

26 Claims, 20 Drawing Sheets

FOREIGN PATENT DOCUMENTS

| | | |
|---|---|---|
| JP | 04010582 A | 1/1992 |
| JP | 04237993 A | 8/1992 |
| JP | 05029602 A | 2/1993 |
| JP | 5-039480 | 2/1993 |
| JP | 5273427 | 10/1993 |
| JP | 5-297202 | 11/1993 |
| JP | 06053591 A | 2/1994 |
| JP | 6-201907 | 7/1994 |
| JP | 6-224115 | 8/1994 |
| JP | 06299148 A | 10/1994 |
| JP | 7-020637 | 1/1995 |
| JP | 7-181689 | 7/1995 |
| JP | 7-235075 | 9/1995 |
| JP | 8-015506 | 1/1996 |
| JP | 5-032523 | 9/1996 |
| JP | 08-248276 | 9/1996 |
| JP | 9178901 | 7/1997 |
| JP | 9211728 | 8/1997 |
| JP | 9-311238 | 12/1997 |
| JP | 10-008300 | 1/1998 |
| JP | 10-026702 | 1/1998 |
| JP | 10-059743 | 3/1998 |
| JP | 63070257 | 3/1998 |
| JP | 10-153967 | 6/1998 |
| JP | 10-279439 | 10/1998 |
| JP | 11329740 A | 11/1999 |
| JP | 2000-173087 | 6/2000 |

* cited by examiner

X1 - X1

X2 - X2

A-A

B-B

C-C

A-A

B-B

C-C

A-A

B-B

C-C

F I G. 1 6
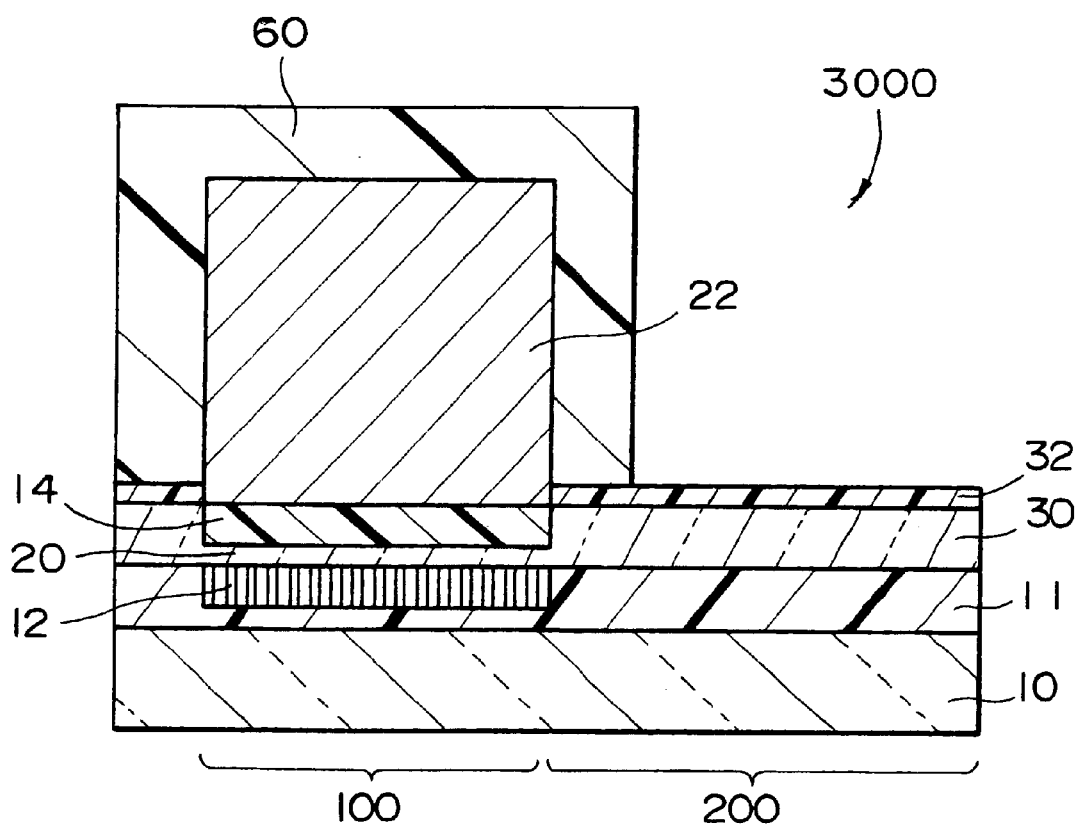

LIGHT-EMITTING DEVICE

TECHNICAL FIELD

The present invention relates to a light-emitting device using electroluminescence (EL).

BACKGROUND OF ART

Semiconductor lasers have been used as a light source for optical communications systems. Semiconductor lasers excel in wavelength selectivity and can emit light with a single mode. However, it is difficult to fabricate semiconductor lasers because many stages of crystal growth are required. Moreover, types of light-emitting materials used for semiconductor lasers are limited. Therefore, semiconductor lasers cannot emit light with various wavelengths.

Conventional EL light-emitting devices which emit light with a broad spectral width have been used in some applications such as for displays. However, EL light-emitting devices are unsuitable for applications related to optical communications and the like, in which light with a narrow spectral width is required.

An objective of the present invention is to provide a light-emitting device which can emit light with a remarkably narrow spectral width in comparison with conventional EL light-emitting devices and exhibiting directivity, and can be applied not only to displays but also optical communications and the like.

DISCLOSURE OF INVENTION

A first light-emitting device according to the present invention comprises a substrate and a light-emitting device section, wherein the light-emitting device section includes:
- a light-emitting layer capable of emitting light by electroluminescence;
- a pair of electrode layers for applying an electric field to the light-emitting layer;
- a light-transmitting section for transmitting light emitted from the light-emitting layer;
- an insulation layer disposed between the electrode layers, having an opening formed in a part of the insulation layer, and functioning as a current concentrating layer for specifying a region through which current supplied to the light-emitting layer flows through a layer in the opening; and
- a grating for light transmitting through the light-transmitting section.

According to this light-emitting device, electrons and holes are injected into the light-emitting layer respectively from the pair of electrode layers (cathode and anode). Light is emitted when the molecules return to the ground state from the excited state by the recombination of the electrons and holes in the light-emitting layer. The light emitted from the light-emitting layer has wavelength selectivity and directivity by the grating for light which is transmitted through the light-transmitting section, specifically, a grating in which two types of mediums having different refractive indices are arranged alternately and periodically.

The light-transmitting section is part of the light-emitting device section and supplies light obtained in the light-emitting layer of the light-emitting device section toward the waveguide section. The light-transmitting section has at least a grating section having a function of providing wavelength selectivity and a member (for example, one of the electrode layers) for connecting a core layer of the waveguide section with the grating.

According to this light-emitting device, since the insulation layer functions as a current concentrating layer in the light-emitting device section, the region where current is supplied to the light-emitting layer can be specified. Therefore, current intensity and current distribution can be controlled in the region from which it is desired to emit light, whereby light can be emitted with high emission efficiency. In the case where the insulation layer functions as cladding and the waveguide has a light-emitting layer as a core and an insulation layer as cladding, the waveguide mode of light transmitted to the waveguide section through the light-transmitting section can be controlled by specifying the opening of the insulation layer. Specifically, the waveguide mode of light transmitted through the light-emitting layer (core) can be set at a predetermined value by specifying the width of the region where light is confined (width of the opening perpendicular to the direction of light) using the insulation layer (cladding). The relation between the waveguide mode and the waveguide is generally represented by the following equation.

$$N\max + 1 \geq K_0 \cdot a \cdot (n_1^2 - n_2^2)^{1/2} / (\pi/2)$$

where
- $K_0: 2\pi/\lambda$
- $a$: half width of core of waveguide
- $n_1$: refractive index of core of waveguide
- $n_2$: refractive index of cladding of waveguide
- $N\max$: maximum value of possible waveguide mode Therefore, when the parameters of the above equation such as the refractive indices of the core and cladding have been specified, the width of the light-emitting layer (core) specified by the width of the opening of the current concentrating layer may be selected according to the desired waveguide mode. Specifically, the width ($2a$) of the light-emitting layer corresponding to the core at a desired waveguide mode can be calculated from the above equation by substituting the refractive indices of the light-emitting layer provided inside the current concentrating layer and the insulation layer (current concentrating layer) for the refractive indices of the core and cladding of the waveguide, respectively. The width of the core layer of the waveguide section to which light is supplied from the light-emitting device section is preferably calculated taking into consideration the resulting width of the light-emitting layer, calculated value obtained from the above equation based on the desired waveguide mode, and the like. Light with a desired mode can be transmitted from the light-emitting device section to the waveguide section with high combination efficiency by appropriately specifying the width of the light-emitting layer, width of the core layer, and the like. In addition, in the light-emitting device section, light-emitting layer in the current concentrating layer formed of the insulation layer may not uniformly emit light. Therefore, it is preferable to suitably adjust the designed values of each member such as the light-emitting layer, light-transmitting section, and waveguide section based on the width ($2a$) of the core (light-emitting layer) calculated from the above equation so that each member exhibits high combination efficiency.

The waveguide mode of the light-emitting device is preferably 0 to 1000. In particular, when used for communications, the waveguide mode is preferably about 0 to 10. Light with a predetermined waveguide mode can be efficiently obtained by specifying the waveguide mode of light in the light-emitting layer.

A second light-emitting device according to the present invention comprises a light-emitting device section and a waveguide section which transmits light emitted from the light-emitting device section, the light-emitting device section and the waveguide section being integrally formed on a substrate, wherein the light-emitting device section includes:
a light-emitting layer capable of emitting light by electroluminescence;
a pair of electrode layers for applying an electric field to the light-emitting layer;
a light-transmitting section for transmitting light emitted from the light-emitting layer;
an insulation layer which is disposed to be in contact with the light-transmitting section and is capable of functioning as a cladding layer; and
a grating for light transmitting through the light-transmitting section, and wherein the waveguide section includes:
a core layer integrally formed with at least part of the light-transmitting section; and
a cladding layer integrally formed with the insulation layer.

According to the second light-emitting device, light with superior wavelength selectivity and directivity can be emitted by the same principle as that of the first light-emitting device.

In the second light-emitting device, at least part of the light-transmitting section of the light-emitting device section and the core layer of the waveguide section are integrally formed. The insulation layer (cladding layer) of the light-emitting device section and the cladding layer of the waveguide section are integrally formed. Therefore, the light-emitting device section and the waveguide section are optically connected with high combination efficiency, whereby light is efficiently transmitted.

In the case of this configuration, as a material for the insulation layer, materials which function as a cladding layer for the light-transmitting section are selected. According to the light-emitting device having this configuration, the light-transmitting section of the light-emitting device section and the core layer of the waveguide section can be formed and patterned in the same step, thereby simplifying the fabrication. The insulation layer (cladding layer) of the light-emitting device section and the cladding layer of the waveguide section can be formed and patterned in the same step, thereby also simplifying the fabrication.

In the first and the second light-emitting devices, the opening of the insulation layer is preferably a slit extending in the periodic direction of the grating, specifically, in the direction to which light is waveguided. At least part of the light-emitting layer is preferably formed in the opening formed in the insulation layer. According to this configuration, the region of the light-emitting layer to which it is desired to supply current and the region specified by the current concentrating layer can be self-alignably positioned.

In the first and second light-emitting devices, the grating is preferably a distributed feedback type grating or a distributed-Bragg-reflection-type grating. Light emitted from the light-emitting layer is caused to resonate by forming such a distributed feedback type grating or distributed-Bragg-reflection-type grating, whereby light having wavelength selectivity, narrow emission spectral width, and excellent directivity can be obtained. In these gratings, the pitch and depth of the grating are set depending on the wavelength of light to be emitted.

Moreover, emission of light with a single mode can be ensured by providing a distributed feedback type grating with a $\lambda/4$ phase shift structure or a gain-coupled structure. "$\lambda$" used herein represents the wavelength of light in the light-transmitting section.

A distributed feedback type grating having a $\lambda/4$ phase shift structure or a gain-coupled structure is a preferable configuration common to the light-emitting devices according to the present invention. It is sufficient for the grating to achieve the above functions, and the region for forming the grating is not limited. For example, the grating may be formed in either the light-transmitting section or in a layer in contact with the light-transmitting section.

The light-emitting layer preferably includes an organic light-emitting material as a light-emitting material. Use of organic light-emitting materials widens the selection range of the material in comparison with the case of using semiconductor materials or inorganic materials, for example. This enables emission of light with various wavelengths.

The light-emitting device according to the present invention may have various structures. Examples of typical structures will be given below.

(a) In a light-emitting device according to a first structure, the light-emitting device section may comprise:
a transparent anode which is formed on the substrate and is capable of functioning as at least part of the light-transmitting section,
a grating formed in part of the anode;
an insulation layer having an opening facing the grating,
a light-emitting layer, at least part of the light-emitting layer being formed in the opening of the insulation layer; and
a cathode.

(b) In a light-emitting device according to a second structure, the light-emitting device section may comprise:
a grating formed in part of the substrate;
a transparent anode which is formed on the grating and is capable of functioning as at least part of the light-transmitting section;
an insulation layer having an opening facing the anode;
a light-emitting layer, at least part of the light-emitting layer being formed in the opening of the insulation layer; and
a cathode.

(c) In a light-emitting device according to a third structure, the light-emitting device section may comprise:
a grating substrate disposed on the substrate, a grating being formed in part of the grating substrate;
a transparent anode which is formed on the grating of the grating substrate and is capable of functioning as at least part of the light-transmitting section;
an insulation layer having an opening facing the anode;
a light-emitting layer, at least part of the light-emitting layer being formed in the opening of the insulation layer; and
a cathode.

The light-emitting devices according to the first to third structures preferably further have a waveguide section integrally formed with the light-emitting device section. The waveguide section has a core layer formed on the substrate or the grating substrate and includes a core layer optically continuous with the anode, and a cladding layer which covers the exposed area of the core layer and is optically continuous with the insulation layer.

As described above, according to the present invention, a light-emitting device which can emit light having a wavelength with a remarkably narrow spectral width in comparison with conventional EL light-emitting devices and exhibiting directivity, and can be applied not only to displays but also optical communications and the like can be provided.

Some of the materials which can be used for each section of the light-emitting device according to the present invention will be illustrated below. These materials are only some of the conventional materials. Materials other than these materials can also be used.

(Light-emitting Layer)

Materials for the light-emitting layer are selected from conventional compounds to obtain light with a predetermined wavelength. As the materials for the light-emitting layer, many organic and inorganic compounds may be used. Of these, organic compounds are preferable in view of availability of wide variety of compounds and film-formability. Various materials can be selected by using organic light-emitting materials in comparison with the case of using semiconductor materials or inorganic materials, for example. This enables light with various wavelengths to be emitted.

As examples of such organic compounds, aromatic diamine derivatives (TPD), oxydiazole derivatives (PBD), oxydiazole dimers (OXD-8), distyrylarylene derivatives (DSA), beryllium-benzoquinolinol complex (Bebq), triphenylamine derivatives (MTDATA), rubrene, quinacridone, triazole derivatives, polyphenylene, polyalkylfluorene, polyalkylthiophene, azomethine zinc complex, polyphyrin zinc complex, benzooxazole zinc complex, and phenanthroline europium complex which are disclosed in Japanese Patent Application Laid-open No. 10-153967, and the like can be given.

Moreover, as materials for the organic light-emitting layer, conventional compounds disclosed in Japanese Patent Application Laid-open No. 63-70257, No. 63-175860, No. 2-135361, No. 2-135359, No. 3-152184, No. 8-248276, No. 10-153967, and the like can be used. These compounds can be used either individually or in combination of two or more.

As examples of inorganic compound, ZnS:Mn (red region), ZnS:TbOF (green region), SrS:Cu, SrS:Ag, SrS:Ce (blue region), and the like can be given.

(Optical Waveguide)

The optical waveguide has a layer which functions as a core, and a layer which has a refractive index lower than that of the core and functions as cladding. Specifically, these layers include the light-transmitting section (core) and insulation layer (cladding) of the light-emitting device section, core layer and cladding layer of the waveguide section, substrate (cladding), and the like. Conventional inorganic and organic materials can be used for the layers for forming the optical waveguide.

As typical examples of inorganic materials, $TiO_2$, $TiO_2$—$SiO_2$ mixture, ZnO, $Nb_2O_5$, $Si_3N_4$, $Ta_2O_5$, $HfO_2$, $ZrO_2$, which are disclosed in Japanese Patent Application Laid-open No. 5-273427, and the like can be given.

As typical examples of organic materials, various conventional resins such as thermoplastic resins, thermosetting resins, and photocurable resins can be given. These resins are appropriately selected depending on the method of forming the layer and the like. For example, use of a resin cured by energy from at least one of heat or light enables utilization of commonly used exposure devices, baking ovens, hot plates, and the like.

As examples of such materials, a UV-curable resin disclosed in Japanese Patent Application No. 10-279439 applied by the applicant of the present invention can be given. As UV-curable resins, acrylic resins are preferable. UV-curable acrylic resins having excellent transparency and capable of curing in a short period of time can be obtained by using commercially-available resins and photosensitizers.

As specific examples of basic components of such UV-curable acrylic resins, prepolymers, oligomers, and monomers can be given.

Examples of prepolymers or oligomers include acrylates such as epoxy acrylates, urethane acrylates, polyester acrylates, polyether acrylates, and spiroacetal-type acrylates, methacrylates such as epoxy methacrylates, urethane methacrylates, polyester methacrylates, and polyether methacrylates, and the like.

Examples of monomers include monofunctional monomers such as 2-ethylhexyl acrylate, 2-ethylhexyl methacrylate, 2-hydroxyethyl acrylate, 2-hydroxyethyl methacrylate, N-vinyl-2-pyrrolidone, carbitol acrylate, tetrahydrofurfuryl acrylate, isobornyl acrylate, dicyclopentenyl acrylate, and 1,3-butanediol acrylate, bifunctional monomers such as 1,6-hexanediol diacrylate, 1,6-hexanediol dimethacrylate, neopentyl glycol diacrylate, neopentyl glycol dimethacrylate, ethylene glycol diacrylate, polyethylene glycol diacrylate, and pentaerythritol diacrylate, and polyfunctional monomers such as trimethylolpropane triacrylate, trimethylolpropane trimethacrylate, pentaerythritol triacrylate, and dipentaerythritol hexaacrylate.

These inorganic and organic materials are illustrated taking only light confinement into consideration. In the case where the light-emitting device section has a light-emitting layer, hole transport layer, electron transport layer, and electrode layer and at least one of these layers functions as the core or cladding layer, the materials for these layers can also be employed as the material for the layers of the optical waveguide.

(Hole Transport Layer)

When using an organic light-emitting layer in the light-emitting device section, a hole transport layer may be formed between the electrode layer (anode) and the light-emitting layer, as required. As the materials for the hole transport layer, materials conventionally used as hole injection materials for photoconductive materials or materials used for a hole injection layer of organic light-emitting devices can be selectively used. As the materials for the hole transport layer, any organic and inorganic substances having a function of either hole injection or electron barrier characteristics may be used. As specific examples of such substances, substances disclosed in Japanese Patent Application Laid-open No. 8-248276 can be given.

(Electron Transport Layer)

When using an organic light-emitting layer in the light-emitting device section, an electron transport layer may be formed between the electrode layer (cathode) and the light-emitting layer, as required. Materials for the electron transport layer are only required to have a function of transporting electrons injected from the cathode to the organic light-emitting layer. Such materials can be selected from conventional substances. For example, substances disclosed in Japanese Patent Application Laid-open No. 8-248276 can be given as specific examples.

(Electrode Layer)

As the cathode, electron injectable metals, alloys, electrically conductive compounds with a small work function (for example, 4 eV or less), or mixtures thereof can be used. Materials disclosed in Japanese Patent Application Laid-open No. 8-248276 can be given as specific examples of such electrode substances.

Metals, alloys, electrically conductive compounds with a large work function (for example, 4 eV or more), or mixtures thereof can be used as the anode. In the case of using optically transparent materials as the anode, transparent conductive materials such as CuI, ITO, $SnO_2$, and ZnO can be used. In the case where transparency is not necessary, metals such as gold can be used.

In the present invention, there are no specific limitations to the method of forming the grating and conventional methods can be employed. Typical examples of such methods will be given below.

(1) Lithographic Method

The grating is formed by irradiating a positive or negative resist with ultraviolet rays, X-rays, or the like and developing the resist thereby patterning the resist layer. As a patterning technology using a resist formed of polymethylmethacrylate or a novolak resin, technologies disclosed in Japanese Patent Applications Laid-open No. 6-224115 and No. 7-20637 can be given.

As a technology of patterning a polyimide using photolithography, technologies disclosed in Japanese Patent Applications Laid-open No. 7-181689 and No. 1-221741, and the like can be given. Furthermore, Japanese Patent Application Laid-open No. 10-59743 discloses a technology of forming a grating from polymethylmethacrylate or titanium oxide on a glass substrate utilizing laser ablation.

(2) Formation of Refractive Index Distribution by Irradiation

The grating is formed by irradiating the optical waveguide section of the optical waveguide with light having a wavelength which causes changes in the refractive index, thereby periodically forming areas having different refractive indices in the optical waveguide section. As such a method, it is preferable to form the grating by forming a layer of polymers or polymer precursors and polymerizing part of the polymer layer by irradiation or the like, thereby periodically forming areas having different refractive indices. Such a technology is disclosed in Japanese Patent Applications Laid-open No. 9-311238, No. 9-178901, No. 8-15506, No. 5-297202, No. 5-32523, No. 5-39480, No. 9-211728, No. 10-26702, No. 10-8300, and No. 2-51101, and the like.

(3) Stamping Method

The grating is formed by hot stamping using a thermoplastic resin (Japanese Patent Application Laid-open No. 6-201907), stamping using an UV curable resin (Japanese Patent Application Laid-open No. 10-279439), stamping using an electron-beam curable resin (Japanese Patent Application Laid-open No. 7-235075), or the like.

(4) Etching Method

The grating is formed by selectively removing a thin film using lithography and etching technology, thereby patterning the film.

Methods of forming the grating are described above. In summary, the grating only has two areas with different refractive indices. The grating may be formed using a method of forming these two areas from two materials having different refractive indices, a method of forming these two areas having different refractive indices from one material by partially modifying the material, and the like.

Each layer of the light-emitting device may be formed using a conventional method. For example, each layer of the light-emitting device is formed using a suitable film-forming method depending on the materials therefor. As specific examples of such a method, a vapor deposition method, spin coating method, LB method, ink jet method, and the like can be given.

BRIEF DESCRIPTION OF DRAWINGS

FIG. 16 is a cross-sectional view schematically showing a light-emitting device according to a third embodiment of the present invention.

BEST MODE FOR CARRYING OUT THE INVENTION

First Embodiment (Device)

Figure 1:
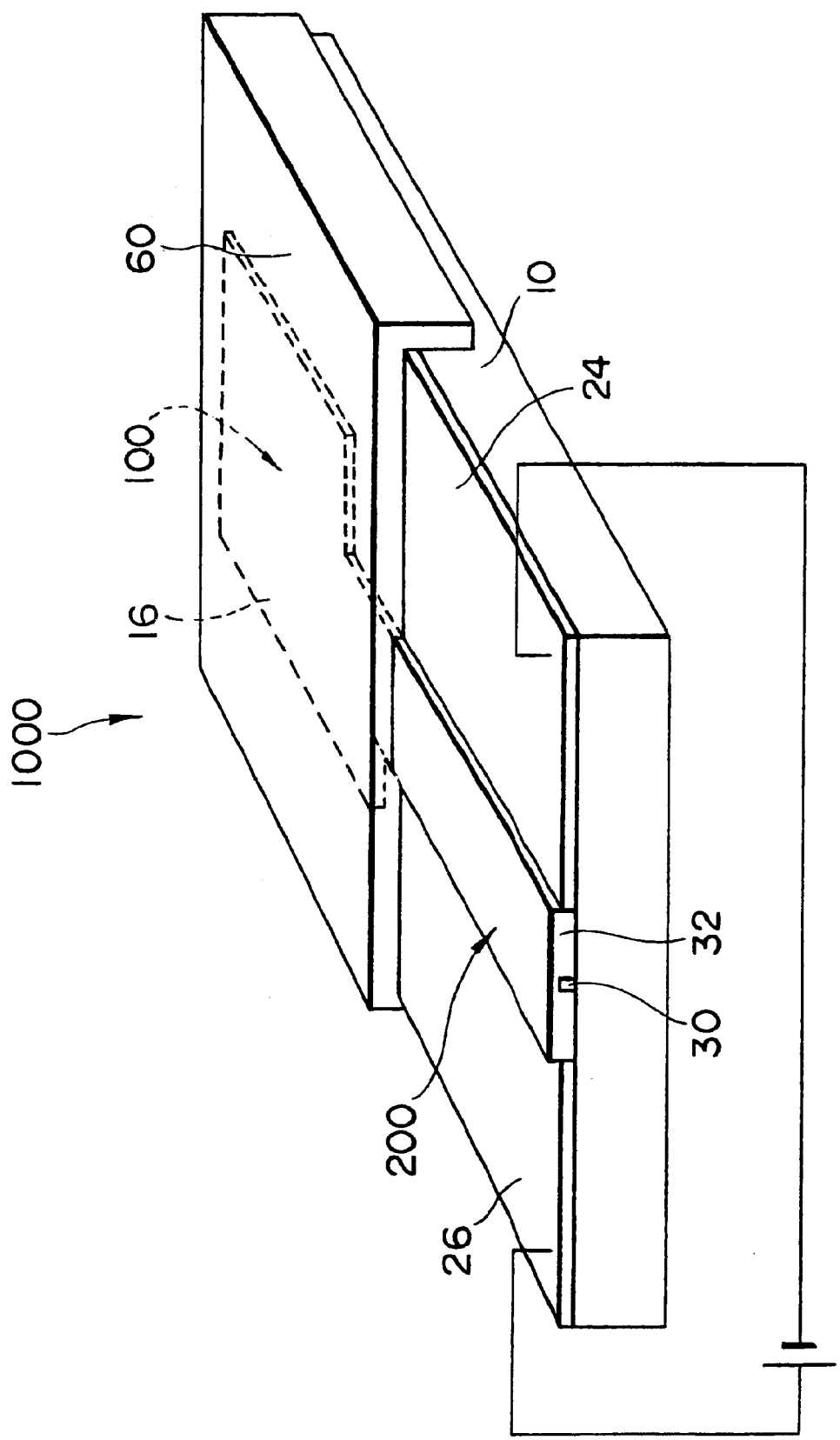
FIG. 1 is a perspective view schematically showing a light-emitting device according to a first embodiment of the present invention.
Figure 2:
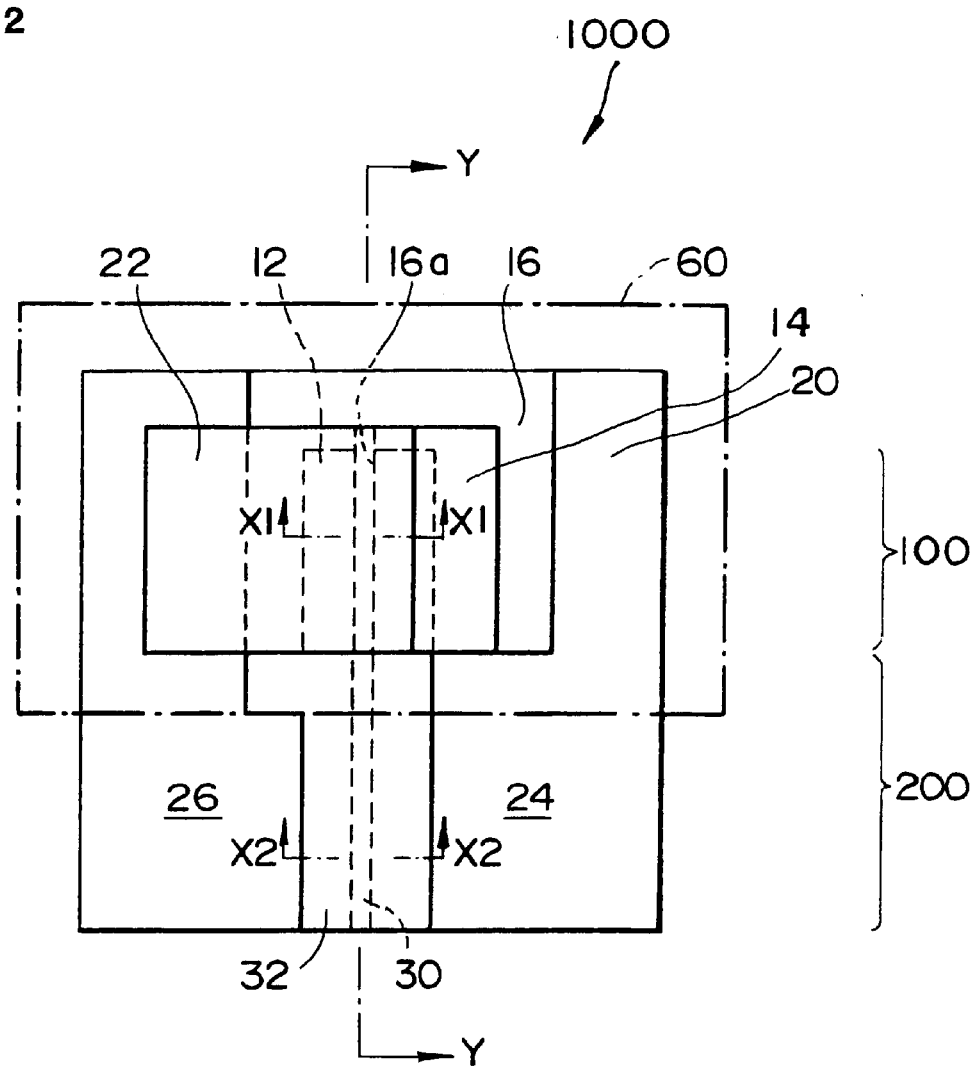
FIG. 2 is a plan view schematically showing a light-emitting device according to the first embodiment of the present invention.
Figure 3A:
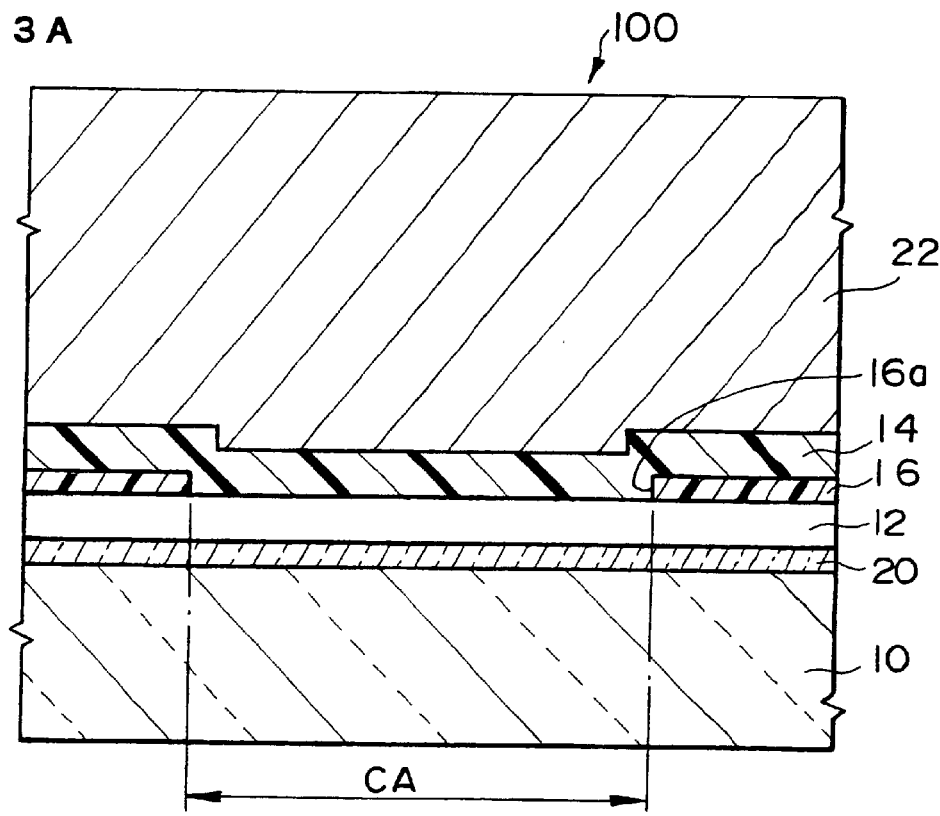
FIG. 3A is a partial cross-sectional view along the line X1—X1 shown in FIG. 2.
Figure 3B:
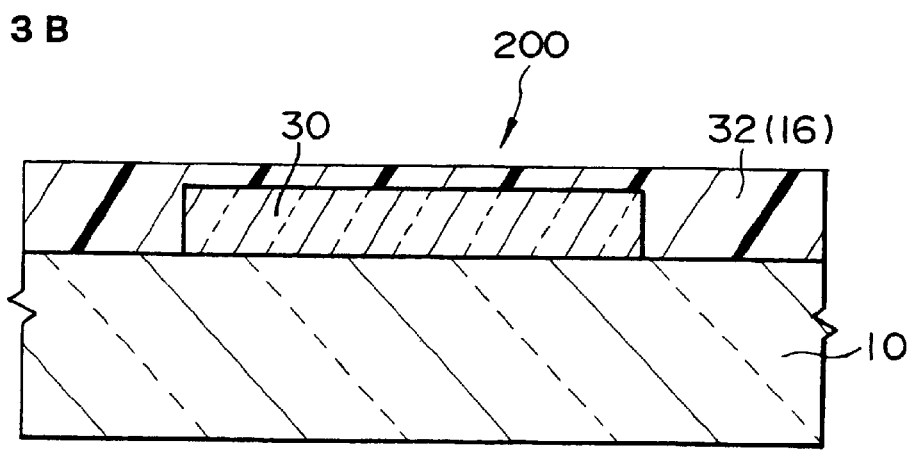
FIG. 3B is a partial cross-sectional view along the line X2—X2 shown in FIG. 2.
Figure 4:
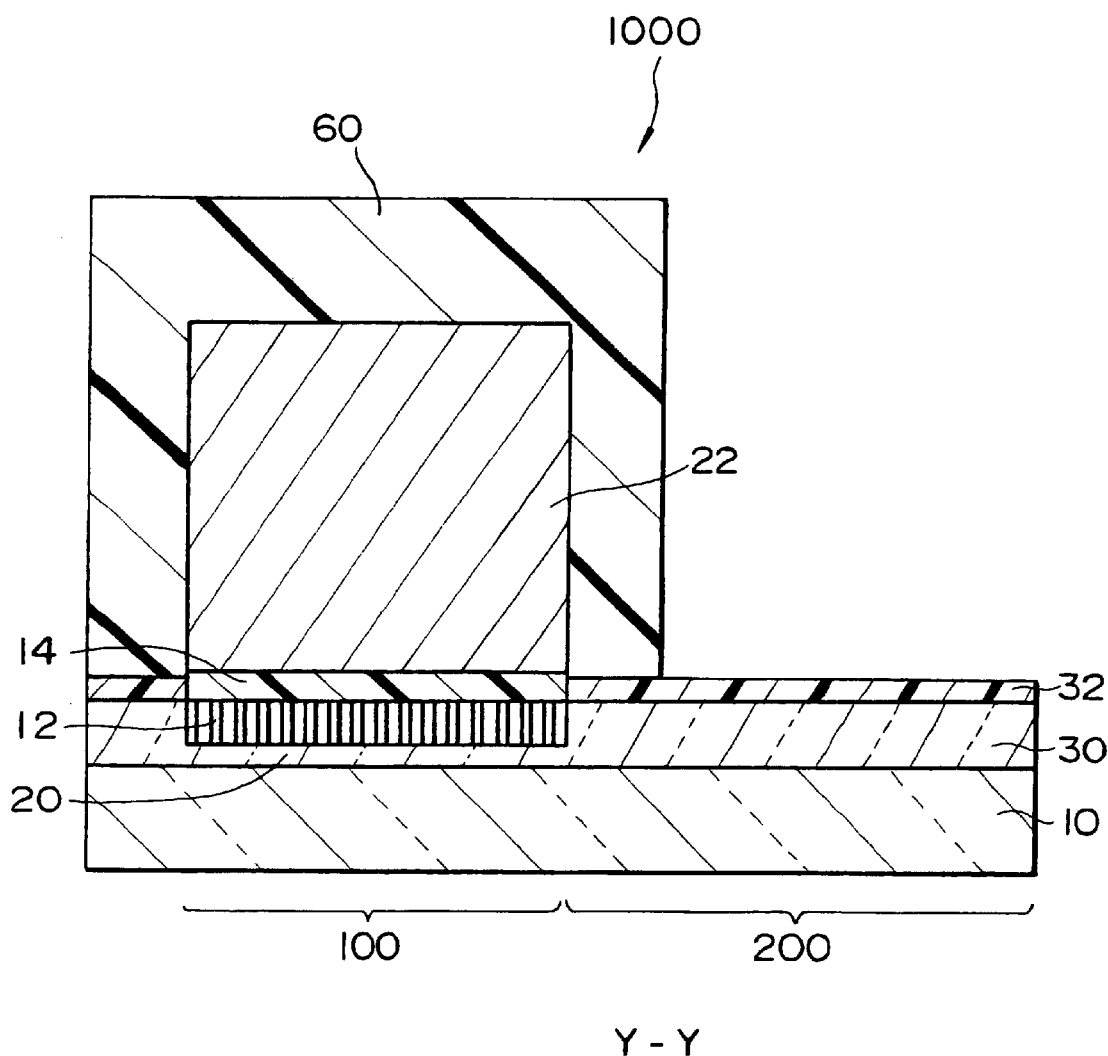
FIG. 4 is a cross-sectional view along the line Y—Y shown in FIG. 2.
Figure 5A:
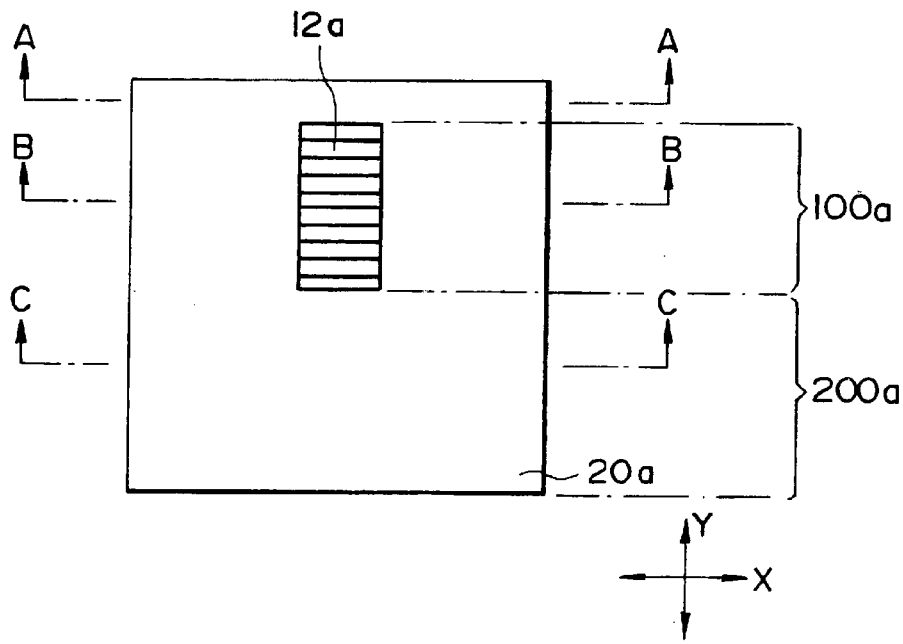
FIG. 5A is a plan view showing a manufacturing process for a light-emitting device according to the first embodiment of the present invention.
Figure 5B:
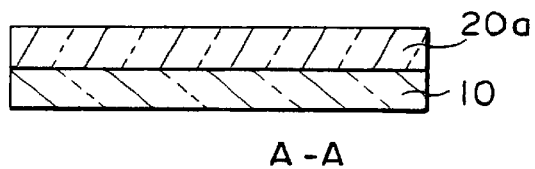
FIGS. 5B to 5D are cross-sectional views along the line A—A, line B—B, and line C—C shown in FIG. 5A, respectively.
Figure 5C:
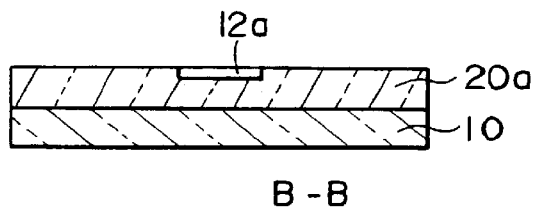
Figure 5D:
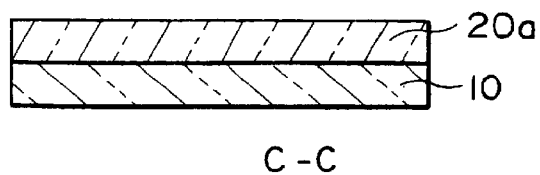
Figure 6A:
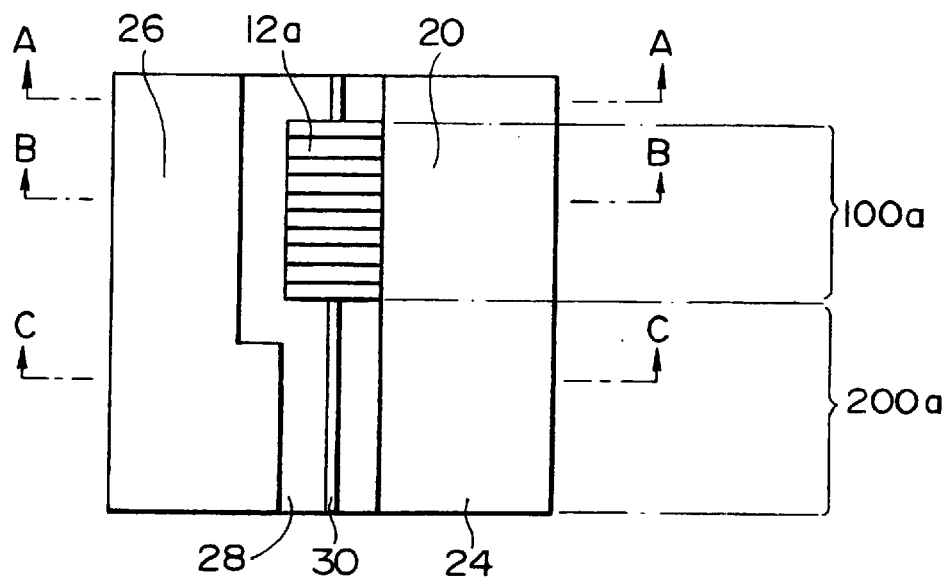
FIG. 6A is a plan view showing a manufacturing process for a light-emitting device according to the first embodiment of the present invention.
Figure 6B:
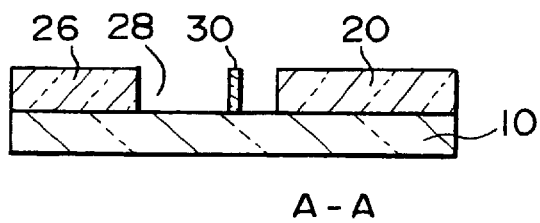
FIGS. 6B to 6D are cross-sectional views along the line A—A, line B—B, and line C—C shown in FIG. 6A, respectively.
Figure 6C:
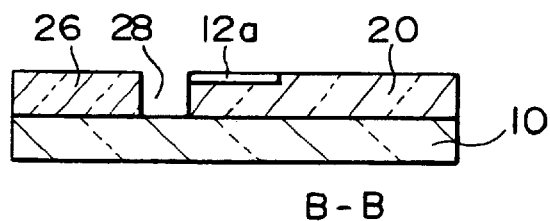
Figure 6D:
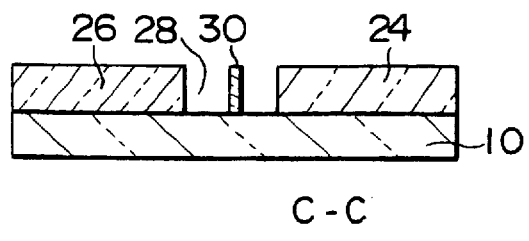
Figure 7A:
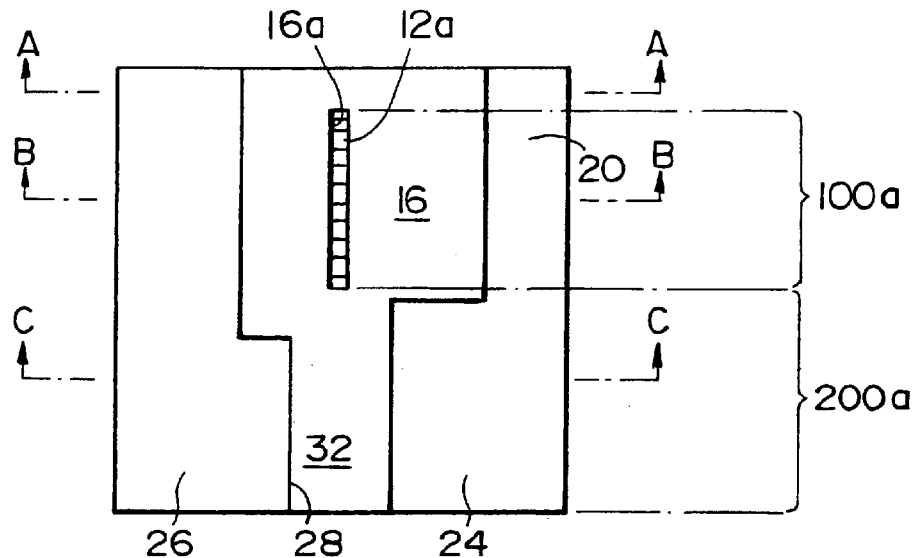
FIG. 7A is a plan view showing a manufacturing process for a light-emitting device according to the first embodiment of the present invention.
Figure 7B:
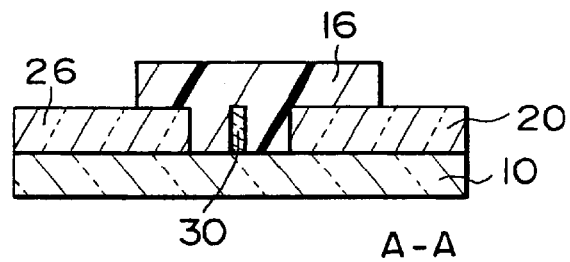
FIGS. 7B to 7D are cross-sectional views along the line A—A, line B—B, and line C—C shown in FIG. 7A, respectively.
Figure 7C:
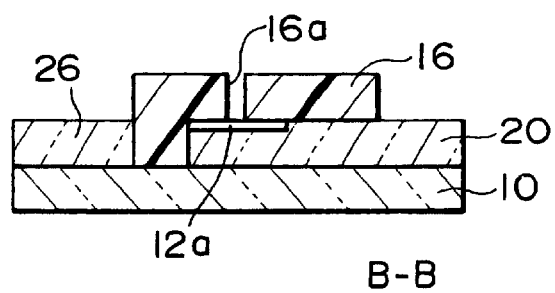
Figure 7D:
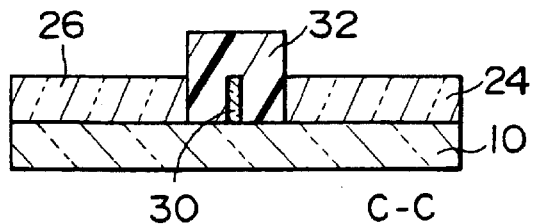

FIG. 1 is a perspective view schematically showing a light-emitting device 1000 according to the present embodiment. FIG. 2 is a plan view schematically showing the light-emitting device 1000. FIG. 3A is a partial cross-sectional view along the line X1—X1 shown in FIG. 2. FIG. 3B is a partial cross-sectional view along the line X2—X2 shown in FIG. 2. FIG. 4 is a cross-sectional view along the line Y—Y shown in FIG. 2.

The light-emitting device 1000 has a substrate 10, a light-emitting device section 100, and a waveguide section 200, which are formed on the substrate 10.

In the light-emitting device section 100, an anode 20, a grating 12, which form a light-transmitting section, a light-emitting layer 14, and a cathode 22 are disposed on the substrate 10 in that order. An insulation layer 16 which functions as a cladding layer and a current concentrating layer is formed to surround the grating 12 excluding part of the grating 12.

In the waveguide section 200, a core layer 30 and a cladding layer 32, which covers an exposed area of the core layer 30, are disposed on the substrate 10. A first electrode drawing section 24 and a second electrode drawing section 26 are disposed, one on either side of the waveguide section 200.

In the present embodiment, a protective layer 60 is formed to cover the light-emitting device section 100. Deterioration of the cathode 12 and the light-emitting layer 14 can be prevented by covering the light-emitting device section 100 using the protective layer 60. In the present embodiment, in order to form the electrode drawing sections 24 and 26, the protective layer 60 is formed on only part of the light-emitting device, thereby exposing the surface of the waveguide section 200. The protective layer 60 may be formed to cover the entire surface of the light-emitting device, as required.

The anode 20 in the light-emitting device section 100 is formed using optically transparent conductive materials and makes up the light-transmitting section. The anode 20 and the core layer 30 in the waveguide section 200 are integrally formed. As the transparent conductive material for the anode 20 and the core layer 30, the above-described materials such as ITO can be used. The insulation layer (cladding Layer) 16 in the light-emitting device section 100 and the cladding layer 32 of the waveguide section 200 are integrally formed. There are no specific limitations to materials for the insulation layer 16 and the cladding layer 32 insofar as the materials exhibit insulating properties, have a refractive index smaller than those of the anode 20 and the core layer 30, and can confine light.

In the light-emitting device section 100, the insulation layer 16 is formed to cover the exposed area of the grating 12, as shown in FIGS. 2 and 3A. The insulation layer 16 has a slit opening 16a which extends in the periodic direction of the grating 12, specifically, in the direction where medium layers having different refractive indices are periodically arranged. The anode 20 and the cathode 22 are disposed in the area where the opening 16a is formed with the grating 12 and the light-emitting layer 14 interposed therebetween. The insulation layer 16 is also interposed between the anode 20 and the cathode 22 in the area where the opening 16a is not formed. The insulation layer 16 functions as a current concentrating layer. Therefore, current mainly flows through a region CA corresponding to the opening 16a when predetermined voltage is applied to the anode 20 and the cathode 22. Current can be concentrated in the direction to which light is waveguided by providing the insulation layer (current concentrating Layer) 16. This increases light emission efficiency.

The grating 12 is formed on the upper part of the light-transmitting section, in which medium layers having different refractive indices are periodically arranged, as shown in FIGS. 3A and 4. One of the medium layers of the grating 12 is formed using the materials for the anode 20, and the other medium layer is formed using the materials for the light-emitting layer 14. The grating 12 is preferably a distributed feedback type grating. Such a distributed feedback type grating causes light to resonate in the light-transmitting section 20, whereby light excelling in wavelength selectivity and directivity and having a narrow emission spectrum width can be obtained. The grating 12 preferably has a $\lambda/4$ phase shifted structure or a gain-coupled structure (not shown in Figures). The grating with a $\lambda/4$ phase shifted structure or a gain-coupled structure ensures emission of light with a single mode.

The first electrode drawing section 24 and the second electrode drawing section 26 on both sides of the waveguide section 200 are electrically isolated by the cladding layer 32 which is continuously formed with the insulation layer 16. The first electrode drawing section 24 is continuously formed with the anode 20 in the light-emitting device section 100 and functions as a drawing electrode for the anode. The second electrode drawing section 26 extends in the direction of the light-emitting device section 100. Part of the second electrode drawing section 26 is electrically connected to the cathode 22. Therefore, the second electrode drawing section 26 functions as a drawing electrode for the cathode 22. In the present embodiment, the first and second electrode drawing sections 24 and 26 are formed in the same film-forming step as that of the anode 20.

The operations and actions of the light-emitting device 1000 will be described.

Electrons and holes are injected into the light-emitting layer 14 from the cathode 22 and the anode 20 respectively by applying predetermined voltage to the anode 20 and the cathode 22. The electrons and holes are recombined whereby excitons are formed in the light-emitting layer 40. Light such as fluorescent light or phosphorescent light is emitted when the excitons are deactivated. Since the region CA through which current flows is specified by the insulation layer 16 interposed between the anode 20 and the cathode 22 as described above, current can be efficiently supplied to the region from which emission of light is desired.

Part of the light emitted from the light-emitting layer 14 is reflected by the cathode 22 and the insulation layer 16 which functions as the cladding layer and is introduced into the light-transmitting section including the anode 20 and the grating 12. Light introduced into the light-transmitting section is transmitted to the edge thereof (to the waveguide 200 section) by distributed feedback type transmission by the grating 12 formed on part of the light-transmitting section. The light is transmitted through the core layer 30 of the waveguide section 200 integrally formed with part of the light-transmitting section (anode 20) and emitted from the edge thereof. Since the light is emitted after being distributed and fed back by the grating 12, the emitted light has wavelength selectivity, narrow emission spectrum width, and excellent directivity. Moreover, the grating 12 with a λ/4 phase shift structure or a gain-coupled structure ensures emission of light with a single mode. "λ" used herein represents the wavelength of light in the light-transmitting section.

In the example shown in the Figures, light emitted from the light-emitting layer 14 is reflected using the reflecting function of the cathode 22. A reflection film with a large reflectance such as a dielectric multi-layer film mirror, may be formed outside the cathode 22, as required. If the cathode 22 is thin, for example, the cathode 22 may transmit light emitted from the light-emitting layer 40. In this case, a reflection film is preferably formed outside the cathode 22. In addition, a reflection film may be formed between the substrate 10 and the anode 20. Light can be confined more securely by forming such a reflection film, thereby increasing light emission efficiency. This modification example can be applied to other embodiments in the same manner as in the present embodiment.

Either the first medium layer or the second medium layer which form the grating 12 may be a gaseous layer such as air. In the case of forming a grating using a gaseous layer in this manner, the difference in the refractive index of the two medium layers which form the grating can be increased while using a material commonly used for light-emitting devices, whereby a grating with high efficiency for the desired wavelength of light can be obtained. This modification example can be applied to other embodiments in the same manner as in the present embodiment.

At least one of a hole transport layer and an electron transport layer may be formed in the organic light-emitting device section, as required. This modification example can be applied to other embodiments in the same manner as in the present embodiment.

Major advantages of the present embodiment will be given below.

(a) At least part (anode 20) of the light-transmitting section of the light-emitting device section 100 is integrally formed with the core layer 30 of the waveguide section 200. This allows the light-emitting device section 100 and the waveguide section 200 to be optically combined with high combination efficiency, thereby ensuring efficient light transmission. The light-transmitting section including the anode 20 and the core layer 30 can be formed and patterned in the same step, thereby simplifying the fabrication.

The insulation layer (cladding Layer) 16 in the light-emitting device section 100 is integrally formed with the cladding layer 32 of the waveguide section 200. This allows the light-emitting device section 100 (light-transmitting section, in particular) and the waveguide section 200 to be optically combined with high combination efficiency, thereby ensuring efficient light transmission. The insulation layer 16 and the cladding layer 32 can be formed and patterned in the same step, thereby simplifying the fabrication.

As described above, according to the light-emitting device 1000 of the present embodiment, the light-emitting device section 100 and the waveguide section 200 can be connected with high combination efficiency, whereby light can be emitted with high efficiency.

(b) The anode 20 and the cathode 22 are electrically connected through the opening 16a of the insulation layer 16. The region through which current flows is specified by the opening 16a. Therefore, the insulation layer 16 functions as a current concentrating layer, whereby current can be supplied to the light-emitting region. This increases the light emission efficiency. Moreover, the light-emitting region can be aligned with the core layer 30 by specifying the region to which current is supplied using the current concentrating layer 16. This also increases the light combination efficiency with the waveguide section 200.

These advantages also apply to other embodiments.

(Manufacturing Process)

A manufacturing example of the light-emitting device 1000 according to the present embodiment will be described with reference to FIGS. 5 to 10. In each of FIGS. 5 to 10, (A) shows a plan view, and (B) to (D) show cross-sectional views along the line A—A, line B—B, and line C—C shown in (A), respectively. Symbols 100a and 200a in FIGS. 5 to 8 respectively show regions where the light-emitting device section 100 and the waveguide section 200 are formed.

(1) Formation of Conductive Layer and Grating

A conductive layer 20a is formed on the substrate 10 using an optically transparent conductive material as shown in FIGS. 5A to 5D. The conductive layer 20a can be formed selectively using the above-described methods depending on the material for the conductive layer 20a and the like. When forming the conductive layer 20a using ITO, a vapor deposition method is preferably used. A convex/concave section 12a for forming one of the medium layers of the grating is formed on the surface of the conductive layer 20a in a region 100a where the light-emitting device section 100 is formed. The convex/concave section 12a can be formed selectively using the above-described lithographic method, stamping method, and the like depending on the material for the conductive layer 20a and the like. When the conductive layer 20a is formed using ITO, for example, the convex/concave section 12a can be formed using lithography and etching, a liquid phase method such as an ink-jet method using liquid ITO, or the like. The convex/concave section 12a of the grating is formed so that the convexities and concavities are continuously formed at a predetermined pitch in the direction Y as shown in FIG. 5.

The conductive layer 20a is then patterned using lithography, for example, thereby forming the anode 20, first and second electrode drawing sections 24 and 26, and core layer 30, as shown in FIGS. 6A to 6D.

The anode 20 and the first electrode drawing section 24 are continuously formed. The second electrode drawing section 26 is separated from the anode 20 and the first electrode drawing section 24 by an opening 28. The convex/concave section 12a of the grating is integrally formed with the anode 20. Part of the anode 20 including the convex/concave section 12a also functions as a light-transmitting section. The core layer 30 is integrally formed with the anode 20 (convex/concave section 12a). The core layer 30 is separated from the first and second electrode drawing sections 24 and 26 by the opening 28.

The electrodes (anode and electrode drawing sections in this example) and optical sections such as the light-transmitting section including the grating and the core layer can be formed at the same time by selecting the material for the conductive layer 20a while taking into consideration optical characteristics such as the refractive index.

(2) Formation of Insulation Layer

The insulation layer 16 with a predetermined pattern is formed so that the opening 28 is filled with the insulation layer 16, as shown in FIGS. 7A to 7D. The insulation layer 16 has the opening 16a which expose part of the convex/concave section 12a of the grating. The opening 16a is a slit extending in the direction to which light is waveguided. Since the region where current flows is specified by the opening 16a, the length and width of the opening 16a are designed taking into consideration the desired current density, desired current distribution, and the like. The insulation layer 16 not only functions as the current concentrating layer but also functions as a cladding layer to confine light. Therefore, the material for the insulation layer 16 is selected taking into consideration insulating and optical characteristics such as the refractive index. When the conductive layer 20a is formed using ITO, for example, a polyimide, polyamide, polyethylene terephthalate, polyether sulfone, silicon polymer, and the like can be used as the material for the insulation layer 16.

The insulation layer 16 electrically separates the anode 20 and the first electrode drawing section 24 from the second electrode drawing section 26, and covers part of the convex/concave section 12a of the grating, thereby functioning as a cladding layer. Moreover, the insulation layer 16 covers the exposed area of the core layer 30, thereby forming the cladding layer 32.

(3) Formation of Light-emitting Layer

Figure 8A:
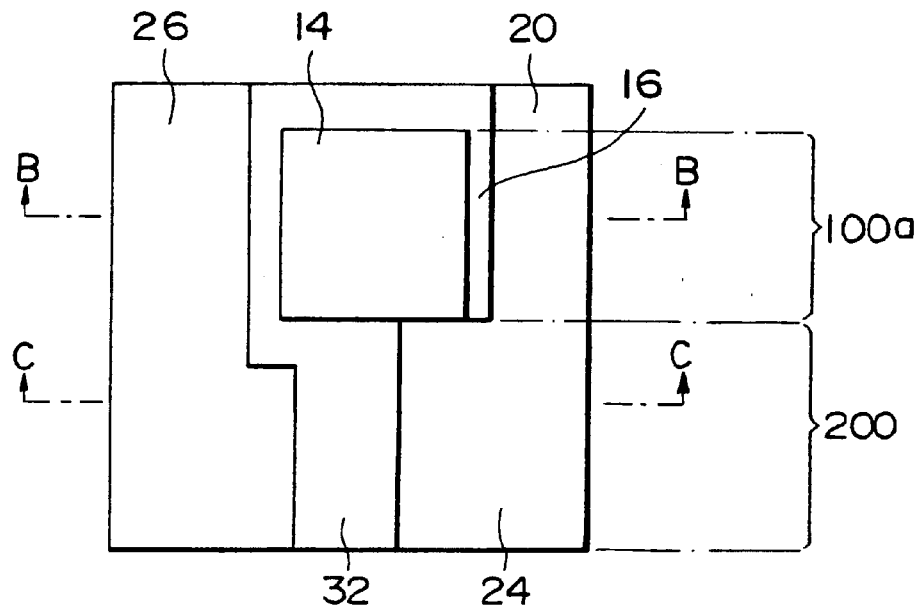
FIG. 8A is a plan view showing a manufacturing process for a light-emitting device according to the first embodiment of the present invention.
Figure 8B:
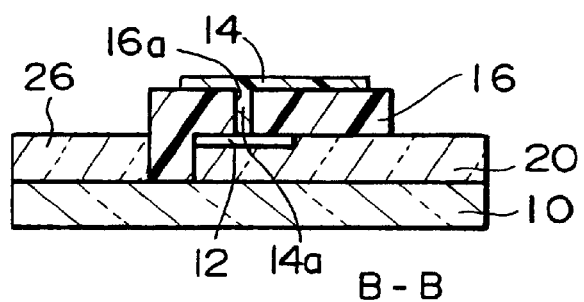
FIGS. 8B and 8C are cross-sectional views along the line B—B and line C—C shown in FIG. 8A, respectively.
Figure 8C:
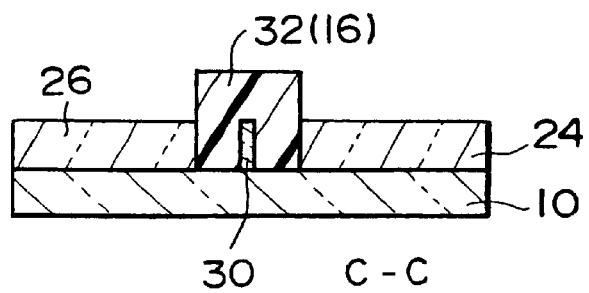

The light-emitting layer 14 is formed in a predetermined region in the region 10a where the light-emitting device section 100 is formed, as shown in FIGS. 8A to 8C. The light-emitting layer 14 has at least a light-emitting section 14a formed by filling the opening 16a formed in the insulation layer 16a with a light-emitting material. The concavities in the convex/concave section 12a of the grating is filled with the material for the light-emitting layer 14, thereby forming the grating 12. Therefore, as the material for forming the light-emitting layer 14, a material having optical functions for forming one of the medium layers of the grating 12 together with light-emitting functions is selected.

(4) Formation of Cathode

Figure 9A:
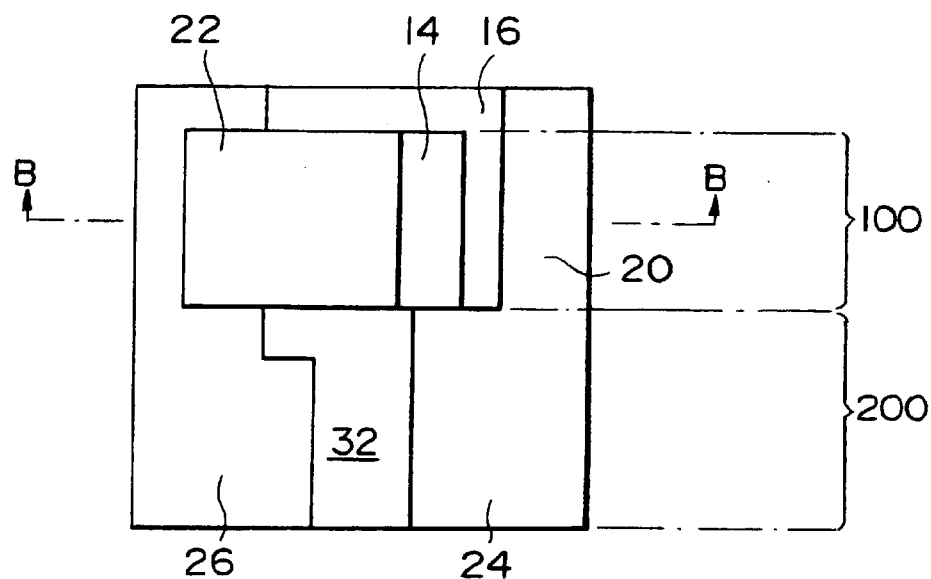
FIG. 9A is a plan view showing a manufacturing process for a light-emitting device according to the first embodiment of the present invention.
Figure 9B:
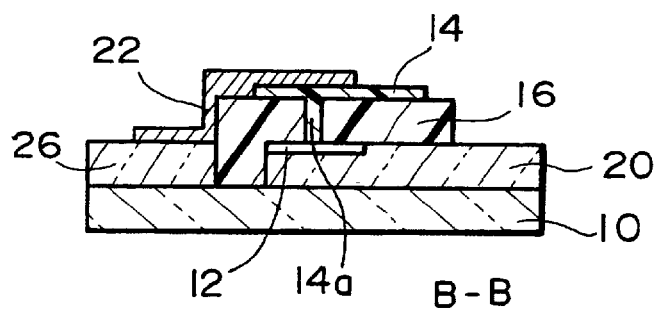
FIG. 9B is a cross-sectional view along the line B—B shown in FIG. 9A.

The cathode 22 is formed in the region 100a where the light-emitting device section 100 is formed, as shown in FIGS. 9A and 9B. The cathode 22 is formed to cover the light-emitting section 14a of the light-emitting layer 14 with one end thereof superposed on the second electrode drawing section 26. The light-emitting device section 100 and the waveguide section 200 are formed in this manner.

(5) Formation of Protective Layer

Figure 10A:
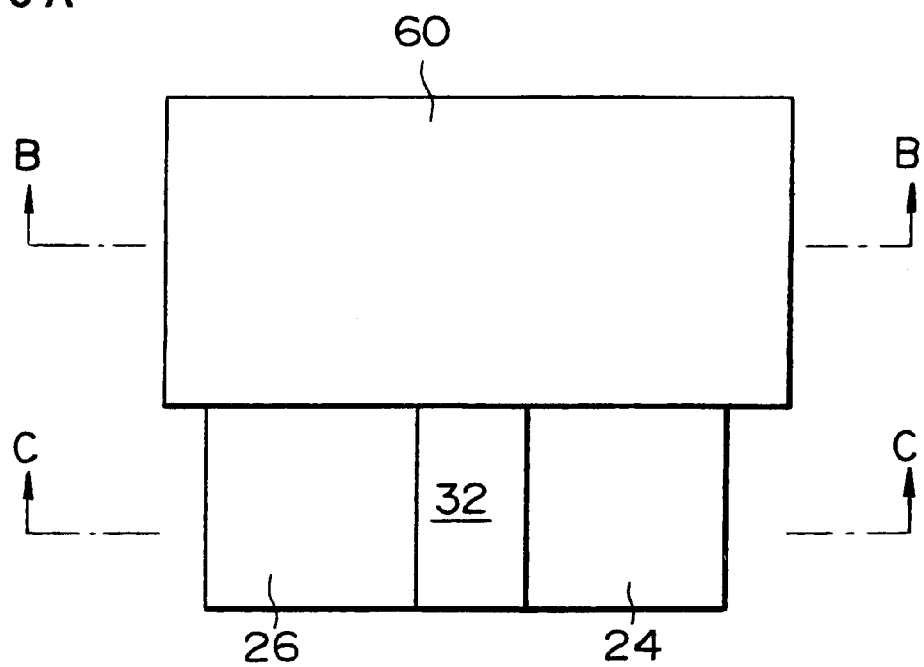
FIG. 10A is a plan view showing a manufacturing process for a light-emitting device according to the first embodiment of the present invention.
Figure 10B:
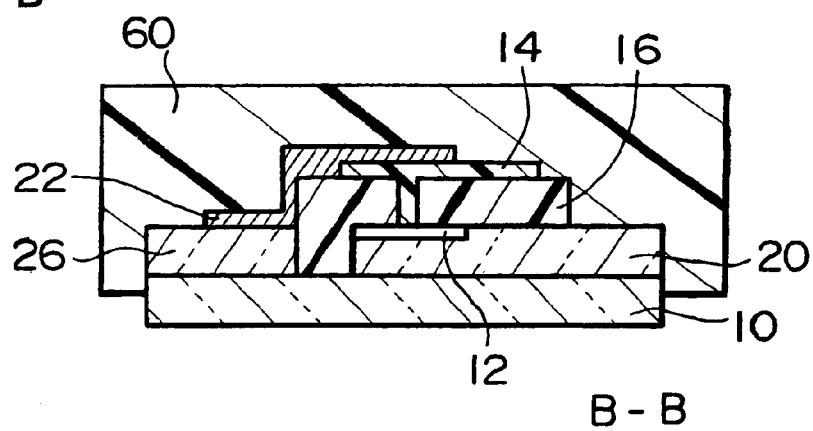
FIGS. 10B and 10C are cross-sectional views along the line B—B and line C—C shown in FIG. 10A, respectively.
Figure 10C:
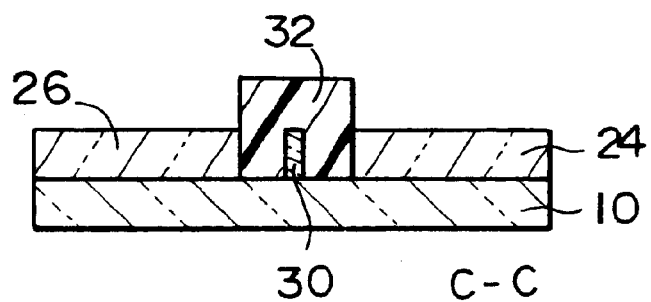

The protective layer 60 is formed to cover at least the light-emitting device section 100 as shown in FIGS. 10A to 10C. The protective layer 60 is preferably formed so that the cathode 22, light-emitting layer 14, and anode (light-transmitting section) 20 are not in contact with the outside. In particular, since the cathode 22 formed of an active metal and the light-emitting layer 14 formed of an organic material tend to deteriorate due to the atmosphere or moisture, the protective layer 60 is formed to prevent such deterioration. The protective layer 60 is preferably formed using a resin material such as an epoxy resin, silicone resin, or UV-curable resin.

The light-emitting device 1000 is formed by the above steps. According to this manufacturing method, the electrodes (anode 20 and electrode drawing sections 24 and 26 in this examples) and optical sections such as the light-transmitting section 20 including the convex/concave section 12a of the grating and the core layer can be formed in the same step by selecting the material for the conductive layer 20a while taking into consideration optical characteristics such as the refractive index, thereby simplifying the manufacturing process.

Second Embodiment

Figure 11:
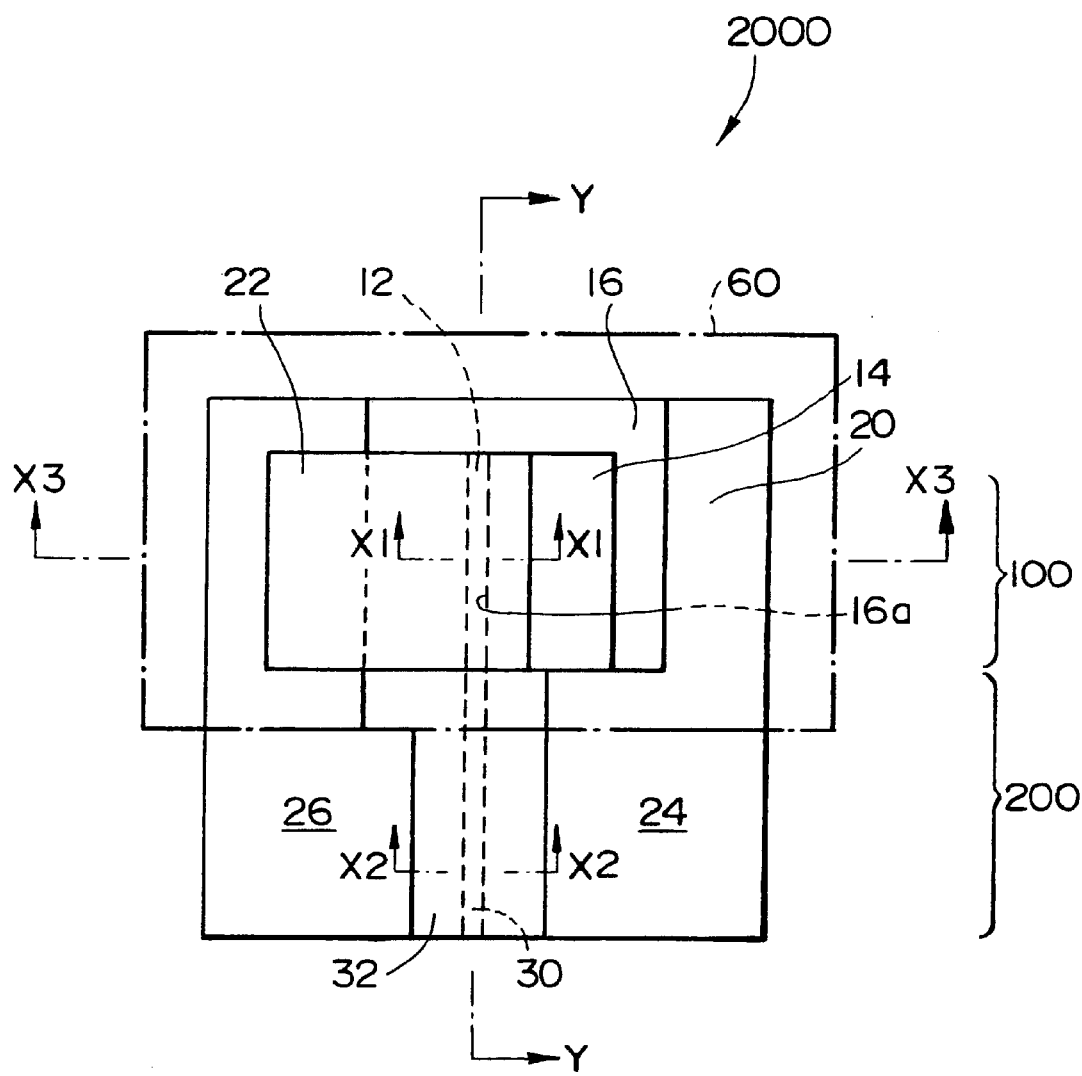
FIG. 11 is a plan view schematically showing a light-emitting device according to a second embodiment of the present invention.
Figure 12A:
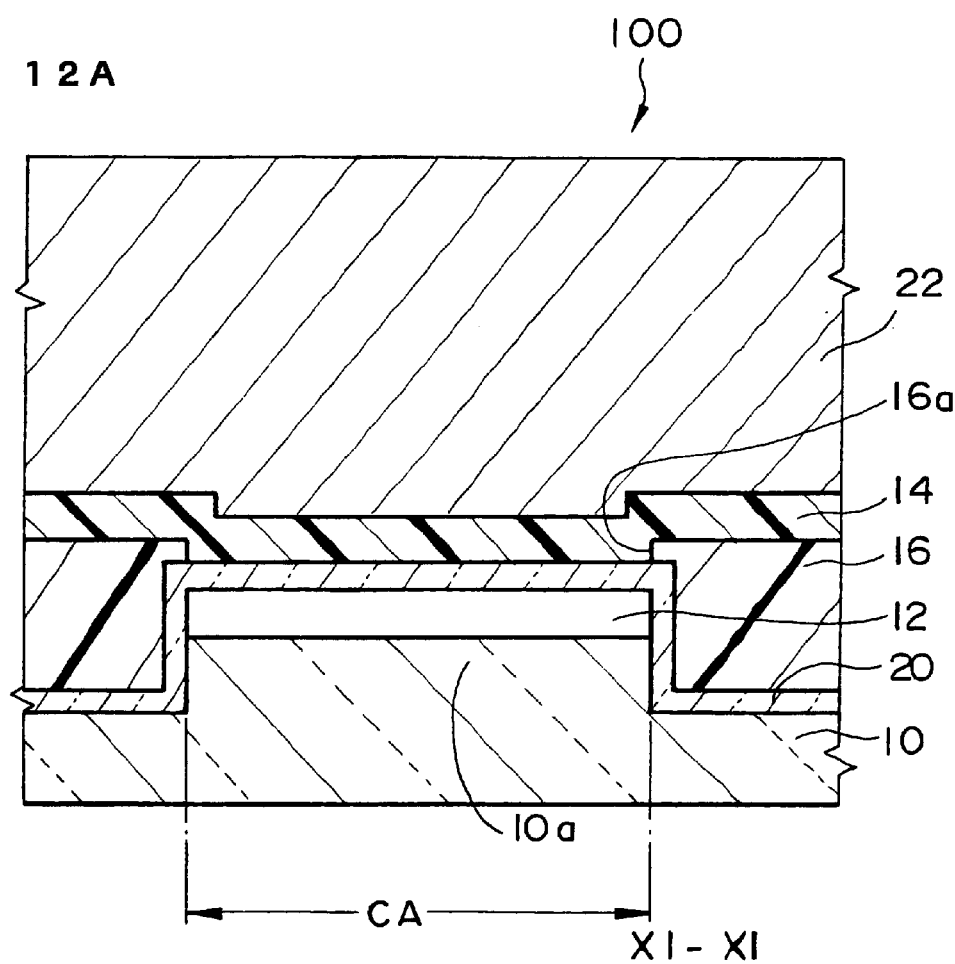
FIG. 12A is a partial cross-sectional view along the line X1—X1 shown in FIG. 11.
Figure 12B:
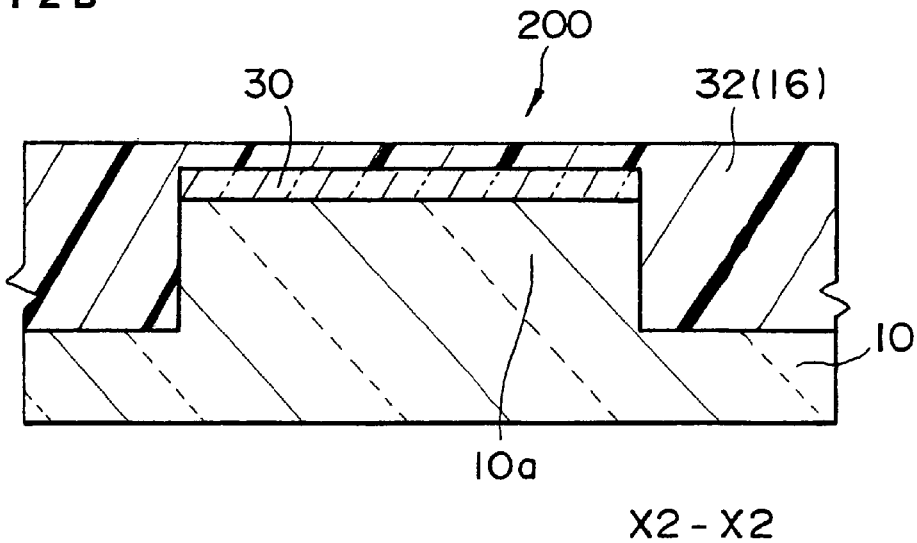
FIG. 12B is a partial cross-sectional view along the line X2—X2 shown in FIG. 11.
Figure 13:
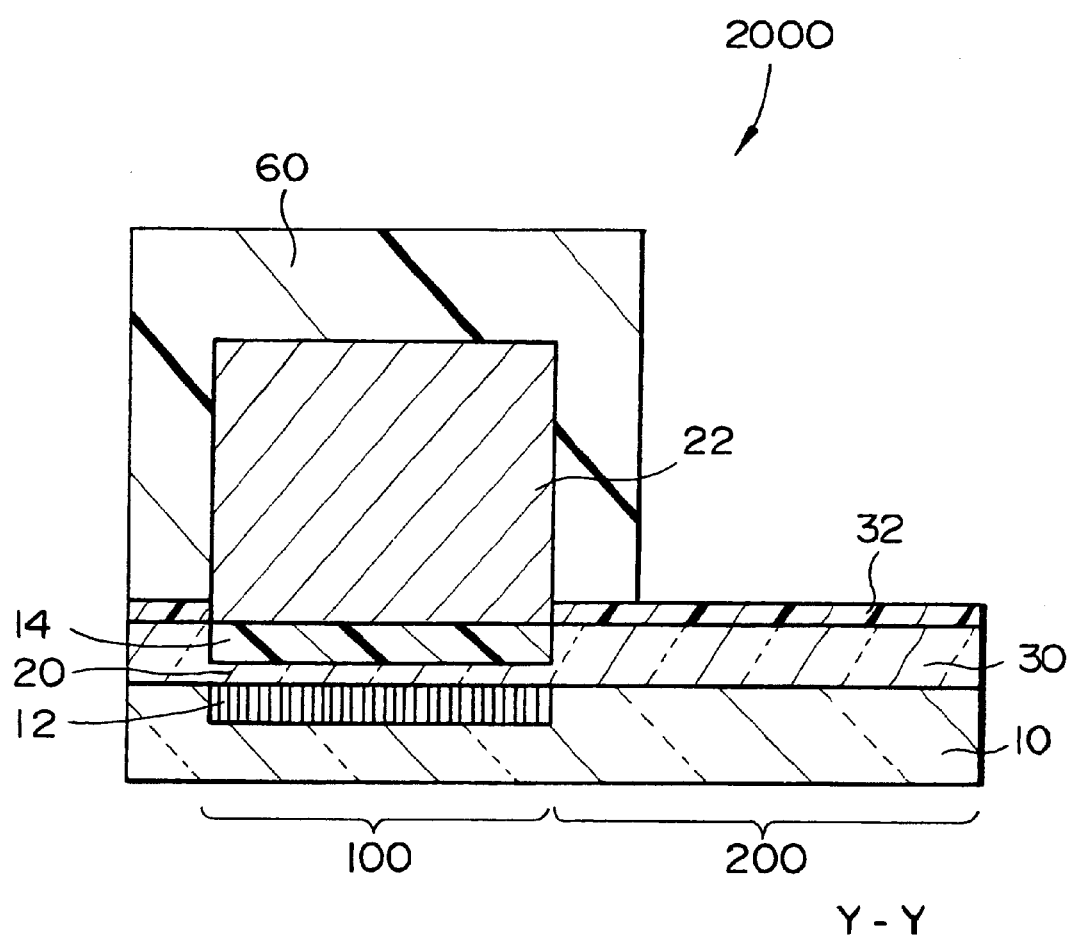
FIG. 13 is a cross-sectional view along the line Y—Y shown in FIG. 11.

FIG. 11 is a plan view schematically showing a light-emitting device 2000 according to the present embodiment. FIG. 12A is a partial cross-sectional view along the line X1—X1 shown in FIG. 11. FIG. 12B is a partial cross-sectional view along the line X2—X2 shown in FIG. 11. FIG. 13 is a cross-sectional view along the line Y—Y shown in FIG. 11.

The light-emitting device 2000 differs from the light-emitting device 1000 according to the first embodiment in the area where the grating and the anode are formed. In the following description, sections having substantially the same functions as those in the light-emitting-device 1000 are represented using the same symbols.

The light-emitting device 2000 has a substrate 10, a light-emitting device section 100, and a waveguide section 200, which are formed on the substrate 10.

In the light-emitting device section 100, a grating 12 which forms a light-transmitting section, an anode 20, a light-emitting layer 14, and a cathode 22 are disposed on a substrate 10 in that order. The substrate 10 has a linear convex section 10a extending through the light-emitting device section 100 and the waveguide section 200. A grating 12 is formed on the convex section 10a. The anode 20 is formed to cover the grating 12. A insulation layer 16 is formed on the anode 20 and the exposed area of the substrate 10 excluding the part of the anode 20. The insulation layer 16 functions as a cladding layer and a current concentrating layer.

In the waveguide section 200, a core layer 30 and a cladding layer 32, which covers the exposed area of the core layer 30, are disposed on the substrate 10. The core layer 30 is formed on the convex section 10a of the substrate 10. A first electrode drawing section 24 and a second electrode drawing section 26 are disposed, one on either side of the waveguide section 200.

In the present embodiment, a protective layer 60 is formed to cover the light-emitting device section 100. Deterioration of the cathode 12 and the light-emitting layer 14 can be prevented by covering the light-emitting device section 100 using the protective layer 60. In the present embodiment, in order to form the electrode drawing sections 24 and 26, the protective layer 60 is not formed over the entire area of the light-emitting device, thereby exposing the surface of the waveguide section 200.

The anode 20 of the light-emitting device section 100 is formed using an optically transparent conductive material, and forms the light-transmitting section. The anode 20 and the core layer 30 of the waveguide section 200 are integrally formed. As the transparent conductive material for the anode 20 and the core layer 30, the above-mentioned materials such as ITO can be used. The insulation layer (cladding Layer) 16 in the light-emitting device section 100 and the cladding layer 32 of the waveguide section 200 are integrally formed. There are no specific limitations to the material for the insulation layer 16 and the cladding layer 32 insofar as the material exhibits insulation capability, has a refractive index smaller than those of the anode 20 and the core layer 30, and can confine light.

In the light-emitting device section 100, the insulation layer 16 is formed to cover the anode 20 and the exposed area of the substrate 10, as shown in FIGS. 11 and 12A. The insulation layer 16 has a slit opening 16a extending in the periodic direction of the grating 12. The anode 20 and the cathode 22 are disposed with the light-emitting layer 14 interposed therebetween in the area where the opening 16a is formed. The insulation layer 16 is interposed between the anode 20 and the cathode 22 in the area where the opening 16a is not formed. Therefore, the insulation layer 16 functions as a current concentrating layer. As a result, current mainly flows through a region CA, corresponding to the opening 16a when predetermined voltage is applied to the anode 20 and the cathode 22. Current can be concentrated in the direction to which light is waveguided by providing the insulation layer (current concentrating layer) 16 in this manner, thereby increasing light emission efficiency.

The grating 12 is formed on the convex section 10a of the substrate 10 and has two different medium layers, as shown in FIGS. 12A and 13. One of the medium layers of the grating 12 is formed using the material for the anode 20, and the other medium layer is formed using the material for the substrate 10. In the present embodiment, the grating 12 is formed to overlap the region CA specified by the current concentrating layer 16 differing from the configuration of the first embodiment. The grating 12 is preferably a distributed feedback type grating. Moreover, the grating 12 preferably has a $\lambda/4$ phase shifted structure or a gain-coupled structure. Since the reason therefor is the same as that in the first embodiment, description thereof is omitted.

As shown in FIG. 1, the first electrode drawing section 24 and the second electrode drawing section 26 formed one on either side of the waveguide section 200 are electrically isolated by the cladding layer 32 continuously formed with the insulation layer 16. The first electrode drawing section 24 is continuously formed with the anode 20 in the light-emitting device section 100 and functions as a drawing electrode for the anode. The second electrode drawing section 26 is formed to extend to the light-emitting device section 100. Part of the second electrode drawing section 26 is electrically connected to the cathode 22. Therefore, the second electrode drawing section 26 functions as a drawing electrode for the cathode 22. In the present embodiment, the first and second electrode drawing sections 24 and 26 are formed in the same film-forming step as that for the anode 20.

The action and effect of the light-emitting device 2000 will be described below.

Electrons and holes are injected into the light-emitting layer 14 respectively from the cathode 22 and the anode 20 by applying predetermined voltage to the anode 20 and the cathode 22. The electrons and holes are recombined in the light-emitting layer 14 whereby excitons are formed. Light such as fluorescent light or phosphorescent light is emitted when the excitons are deactivated. Since the region CA through which current flows is specified by the insulation layer 16 interposed between the anode 20 and the cathode 22 as described above, current can be efficiently supplied to the region from which light should be emitted.

Part of the light emitted from the light-emitting layer 14 is reflected by the cathode 22 and the insulation layer 16 which functions as the cladding layer, and is introduced into the light-transmitting section. Light introduced into the light-transmitting section is transmitted by distributed feedback type transmission by the grating 12 through the light-transmitting section which forms the anode 20 toward the edge thereof. The light is transmitted through the core layer 30 of the waveguide section 200 integrally formed with part of the light-transmitting section (anode 20), and emitted from the edge thereof. Since the light is emitted after being distributed and fed back in the light-transmitting section by the grating 12, the emitted light has wavelength selectivity, narrow emission spectrum width, and excellent directivity.

Major advantages of the present embodiment will be given below.

(a) At least part (anode 20) of the light-transmitting section of the light-emitting device section 100 and the core layer 30 of the waveguide section 200 are integrally formed. This allows the light-emitting device section 100 and the waveguide section 200 to be optically combined with high combination efficiency, thereby ensuring efficient light transmission. Since the light-transmitting section including the anode 20 and the core layer 30 can be formed and patterned god in the same step, fabrication is simplified.

The insulation layer (cladding layer) 16 in the light-emitting device section 100 and the cladding layer 32 of the waveguide section 200 are integrally formed. This allows the light-emitting device section 100 and the waveguide section 200 to be optically combined with high combination efficiency, thereby ensuring efficient light transmission. Since the insulation layer 16 and the cladding layer 32 can be formed and patterned in the same step, fabrication is simplified.

As described above, according to the light-emitting device 2000 of the present embodiment, the light-emitting device section 100 and the waveguide section 200 can be combined with high combination efficiency, whereby light can be emitted with high efficiency.

(b) The anode 20 and the cathode 22 are electrically connected through the opening 16a of the insulation layer 16. The region through which current flows is specified by the opening 16a. Therefore, the insulation layer 16 functions as a current concentrating layer, whereby current can be efficiently supplied to the light-emitting region. This increases light emission efficiency. Moreover, the light-emitting region can be aligned with the core layer 30 by specifying the region to which current is supplied using the current concentrating layer 16. This also increases light combination efficiency with the waveguide section 200.

(c) Since the region in which the grating 12 is formed almost corresponds to the region CA through which current flows specified by the current concentrating layer 16, light can be emitted with higher current efficiency.

(Manufacturing Method of Light-emitting Device)

A manufacturing example of the light-emitting device 2000 according to the present embodiment will be described with reference to FIGS. 14 and 15. (A) to (D) in FIGS. 4 and 5 are cross-sectional views along the line X3—X3 shown in FIG. 11.

(1) Formation of Conductive Layer and Grating

Figure 14A:
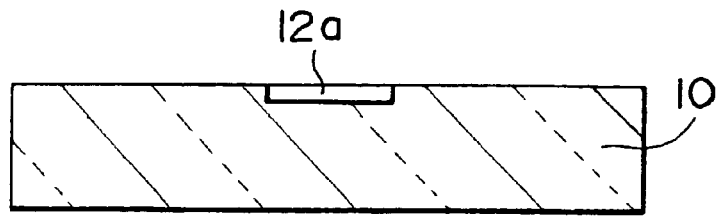
FIGS. 14A to 14D are cross-sectional views showing a manufacturing process for a light-emitting device according to the second embodiment of the present invention.
Figure 14B:
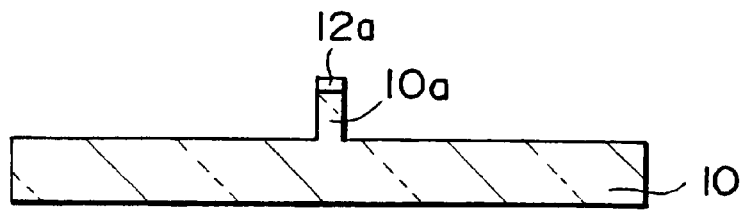

As shown in FIG. 14A, the convex/concave section 12a for forming one of the medium layers of the grating is formed in a predetermined region of the substrate 10. A predetermined area of the substrate 10 is then removed using lithography or the like so as to leave part of the convex/concave section 12a, thereby forming the convex section 10a being continuous with the substrate 10 and the convex/concave section 12a for the grating on the convex section 10a. In FIG. 14, the convex/concave section 12a for the grating is formed so that the convexities and concavities are formed continuously in the horizontal direction at a predetermined pitch.

Figure 14C:
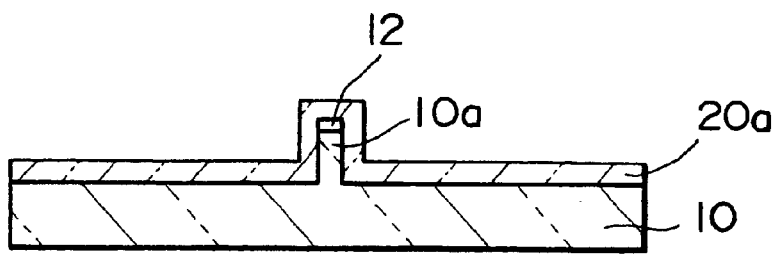
Figure 14D:
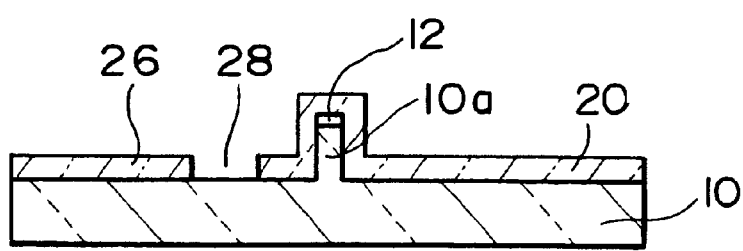

The conductive layer 20*a* is formed over the entire surface of the substrate 10 using an optically transparent conductive material, as shown in FIG. 14C. The conductive layer 20*a* is patterned using lithography, for example, thereby forming the anode 20, first electrode drawing section 24 (see FIG. 11), second electrode drawing section 26, grating 12, and core layer 30 (see FIG. 11), as shown in FIG. 14D. The first medium layer of the grating 12 is formed using the material for the substrate 10, and the second medium layer is formed using the material for the anode 10.

The anode 20 and the first electrode drawing section 24 are continuously formed. The second electrode drawing section 26 is separated from the anode 20 and the first electrode drawing section 24 by the opening 28. The core layer 30 is integrally formed with the anode 20, and is separated from the first and second electrode drawing sections 24 and 26 by the opening 28.

The electrode sections (anode and electrode drawing sections in this example) and optical sections such as the grating, light-transmitting section, and core layer can be formed at the same time by selecting the material for the conductive layer 20*a* while taking into consideration optical characteristics such as the refractive index.

(2) Formation of Insulation Layer

Figure 15A:
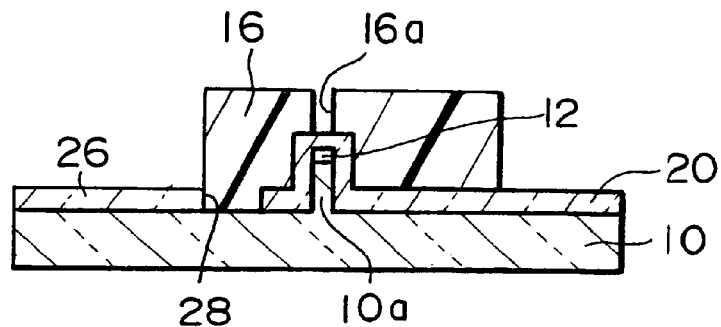
FIGS. 15A to 15D are cross-sectional views showing a manufacturing process for a light-emitting device according to the second embodiment of the present invention.

The insulation layer 16 with a predetermined pattern is formed so that the opening 28 is filled with the insulation layer 16, as shown in FIG. 15A. The insulation layer 16 has the opening 16*a*. The opening 16*a* is a slit extending in the direction to which light is waveguided. Since the region through which current flows is specified by the opening 16*a*, the length and the width of the opening 16*a* are designed while taking into consideration the desired current density, desired current distribution, and the like. The insulation layer 16 not only functions as the current concentrating layer but also functions as the cladding layer to confine light. Therefore, the material for the insulation layer 16 is selected while taking into consideration insulation and optical characteristics such as the refractive index.

The insulation layer 16 electrically separates the anode 20 and the first electrode drawing section 24 from the second electrode drawing section 26 The insulation layer 16 covers part of the anode 20 which forms part of the light-transmitting section, thereby functioning as a cladding layer. Moreover, the insulation layer 16 forms the cladding layer 32 which covers the exposed area of the core layer 30.

(3) Formation of Light-emitting Layer

Figure 15B:
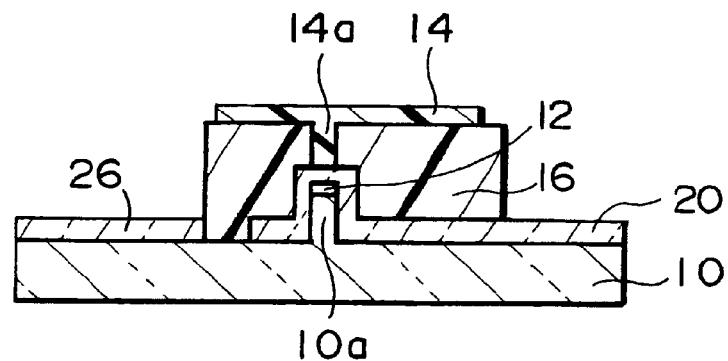

The light-emitting layer 14 is formed in a predetermined area of the region where the light-emitting device section 100 is formed as shown in FIG. 15B. The light-emitting layer 14 has at least a light-emitting section 14*a* in which the opening 16*a* formed in the insulation layer 16 is filled with a light-emitting material.

(4) Formation of Cathode

Figure 15C:
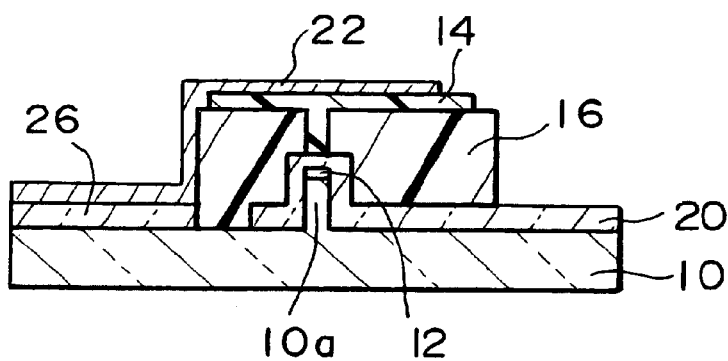

The cathode 22 is formed in the region where the light-emitting device section 100 is formed, as shown in FIG. 15C. The cathode 22 is formed to cover the light-emitting section 14*a* of the light-emitting layer 14. One end of the cathode 22 is superposed on the second electrode drawing section 26. The light-emitting device section 100 and the waveguide section 200 are formed in this manner.

(5) Formation of Protective Layer

Figure 15D:
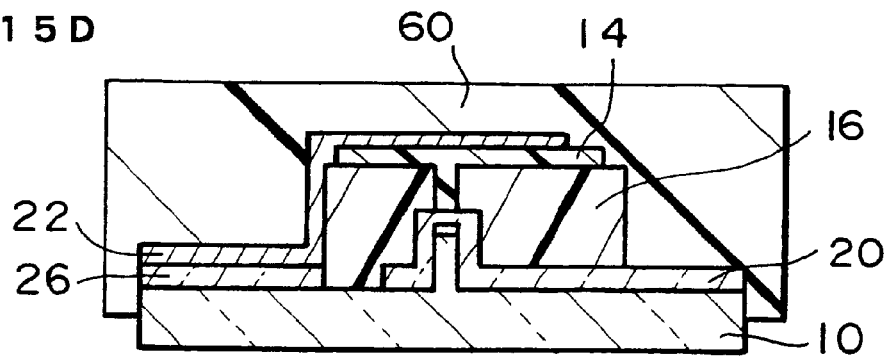

The protective layer 60 is formed to cover at least the light-emitting device section 100, as shown in FIG. 15D. Since the protective layer 60 is the same as that in the first embodiment, description thereof is omitted.

The light-emitting device 2000 is formed by the above steps. According to this manufacturing method, the electrode sections (anode 20 and electrode drawing sections 24 and 26 in this example) and optical sections such as the grating 12, at least part of the light-transmitting section, and core layer 30 can be formed at the same time by selecting the material for the conductive layer 20*a* while taking into consideration optical characteristics such as the refractive index. This simplifies the fabrication process.

Third Embodiment

FIG. 16 is a cross-sectional view schematically showing a light-emitting device 3000 according to the present embodiment. FIG. 16 shows part of the light-emitting device 3000 corresponding to the light-emitting device shown in FIG. 13 used to describe the second embodiment.

The light-emitting device 3000 differs from the light-emitting device 1000 according to the first embodiment and the light-emitting device 2000 according to the second embodiment in the area where the grating is formed. Sections having substantially the same functions as those in the light-emitting devices 1000 and 2000 are represented using the same symbols. In the following description, only major features of the light-emitting device 3000 differing from those of the light-emitting devices 1000 and 2000 will be described.

The light-emitting device 3000 has a substrate 10, a light-emitting device section 100, and a waveguide section 200, which are formed on the substrate 10.

In the light-emitting device section 100, a grating 12 which forms a light-transmitting section, an anode 20, a light-emitting layer 14, and a cathode 22 are disposed on the first substrate 10 in that order. In the present embodiment, a second substrate (grating substrate) 11 for forming the grating 12 is disposed on the first substrate 10. The second substrate 11 is preferably formed using a material which can easily form the grating 12 in comparison with that for the first substrate 10, or a material with a refractive index higher than that of the first substrate. The second substrate 11 can be formed using resins to which lithography, formation of a refractive index distribution by irradiation, stamping method, and the like can be applied, such as resins curable upon irradiation by ultraviolet rays or electron beams. In the example shown in Figure, a first medium layer of the grating 12 is formed using the material for the second substrate 11, and the second medium layer is formed using the material for the anode 20 which forms the light-transmitting section.

In the present embodiment, since a material advantageous for forming the grating 12 can be selected as the material for the second substrate 11, formation of the grating 12 becomes easy. For example, flexible substrate materials can be used differing from the first substrate 10. In particular, in the case of forming the grating by applying the material for the second substrate 11 onto the first substrate 10 using a rigid mold, curing the material by heating, and removing the mold, the mold can be easily removed and the grating can be formed with higher accuracy. When providing not only the light-emitting device section but also other members or devices on the second substrate 11, the most suitable material for the substrate can be selected, whereby the light-emitting device having optimum characteristics can be obtained.

Other configurations and effect of the light-emitting device 3000 are the same as those of the light-emitting device 2000 according to the second embodiment. Therefore, further description will be omitted.

Fourth Embodiment

Figure 17:
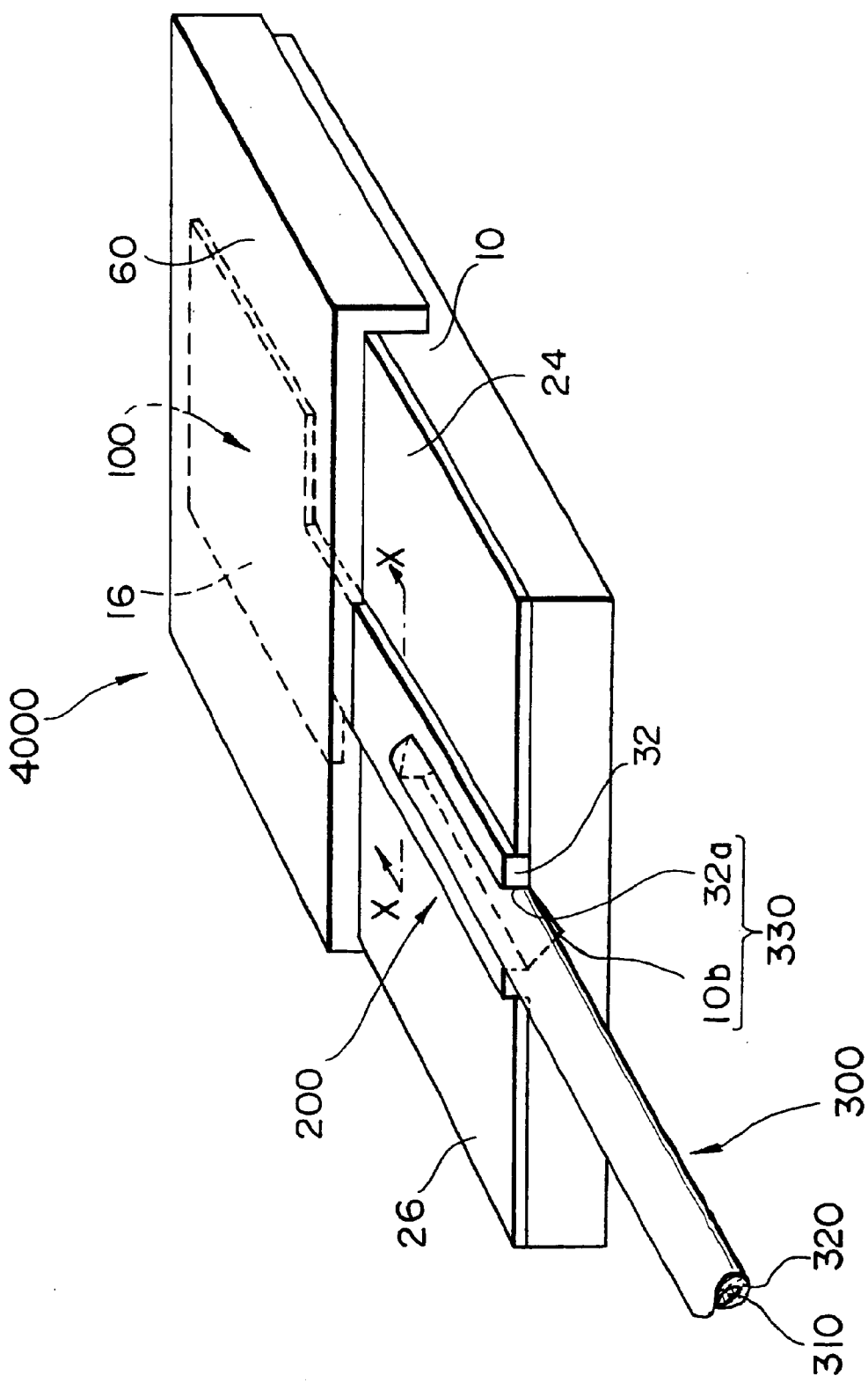
FIG. 17 is a perspective view schematically showing a light-emitting device according to a fourth embodiment of the present invention.
Figure 18:
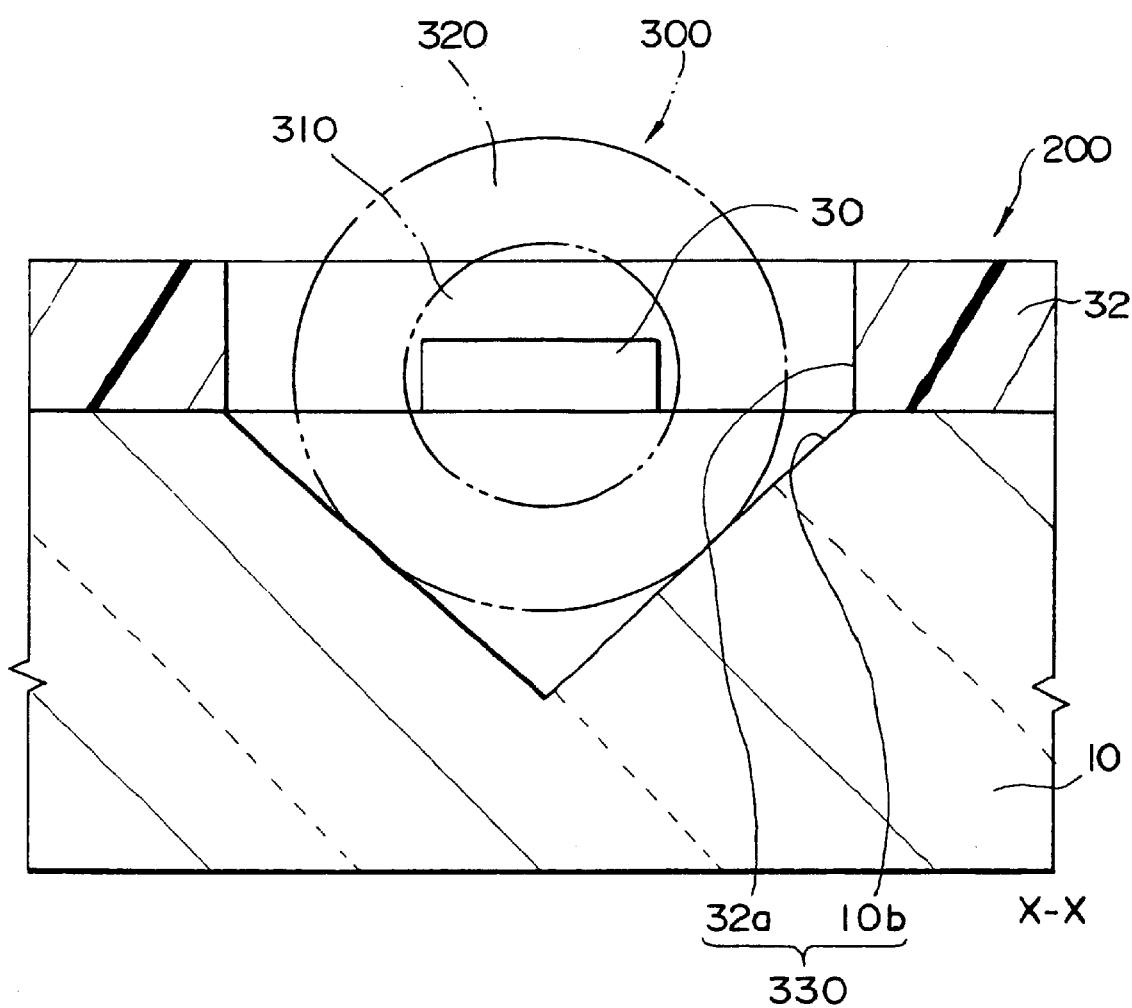
FIG. 18 is a cross-sectional view along the line X—X shown in FIG. 17.

FIG. 17 is a perspective view schematically showing a light-emitting device 4000 according to the present embodiment. FIG. 18 is a cross-sectional view along the line X—X shown in FIG. 17.

The light-emitting device 4000 differs from the light-emitting devices according to the first embodiment and other embodiments in the structure of the waveguide section. Sections having substantially the same functions as those in the light-emitting device 1000 are represented using the same symbols. In the following description, only major features of the light-emitting device 4000 differing from those of the light-emitting device 1000 will be described.

The light-emitting device 4000 has a substrate 10, a light-emitting device section 100, and a waveguide section 200, which are formed on the substrate 10.

The feature of the present embodiment is that the waveguide section 200 is equipped with an optical fiber 300. The optical fiber 300 has a core layer 310, a cladding layer 320, and a coating layer (not shown).

An optical fiber receiving section 330 into which the end of the optical fiber 300 is placed and secured is formed in the waveguide section 200. The optical fiber receiving section 330 is formed of a first convex/concave section 32a with a rectangular cross section formed in the cladding layer 32, and a second convex/concave section 10b with a triangular cross section formed in the substrate 10. The optical fiber receiving section 330 is formed so that at least the core layer 30 of the waveguide section 200 faces the core layer 310 of the optical fiber 300 when placing and positioning the end of the optical fiber 300 in the optical fiber receiving section 330. The optical fiber 300 can be secured to the waveguide section 200 using adhesives or the like.

According to the light-emitting device 4000, light emitted from the light-emitting device section 100 can be efficiently transmitted to the optical fiber 300 through the waveguide section 200. Since the light-emitting device 4000 has the optical fiber 300, the light-emitting device 4000 can be preferably applied to optical communications devices, for example.

Other configurations and effects of the light-emitting device 4000 are the same as those of the light-emitting devices according to the first and other embodiments. Therefore, further description will be omitted.

In the example shown in Figures, the light-emitting device 4000 has the optical fiber 300 which is integrally formed. However, the present embodiment is not limited to this configuration. For example, the light-emitting device 4000 may have the optical fiber receiving section 330 which may be formed in the waveguide section 200 without using optical fiber. In the case of such a device, the optical fiber may be connected to the optical fiber receiving section 330, if necessary.

In the device having the optical fiber 300 shown in FIG. 17, the protective layer 60 may be formed to cover part of the optical fiber 300 including not only the light-emitting device section 100 but also the joint between the end of the optical fiber 300 and the core layer 30 of the waveguide section 200. In this case, the optical fiber 300 can be more reliably secured.

Fifth Embodiment

Figure 19:
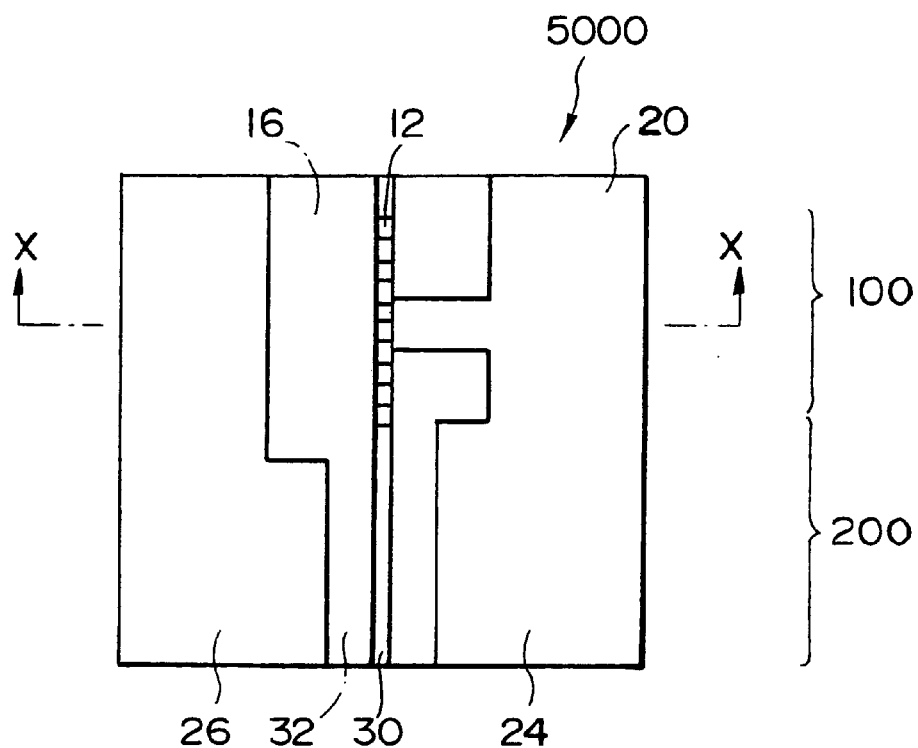
FIG. 19 is a plan view schematically showing a light-emitting device according to a fifth embodiment of the present invention.
Figure 20:
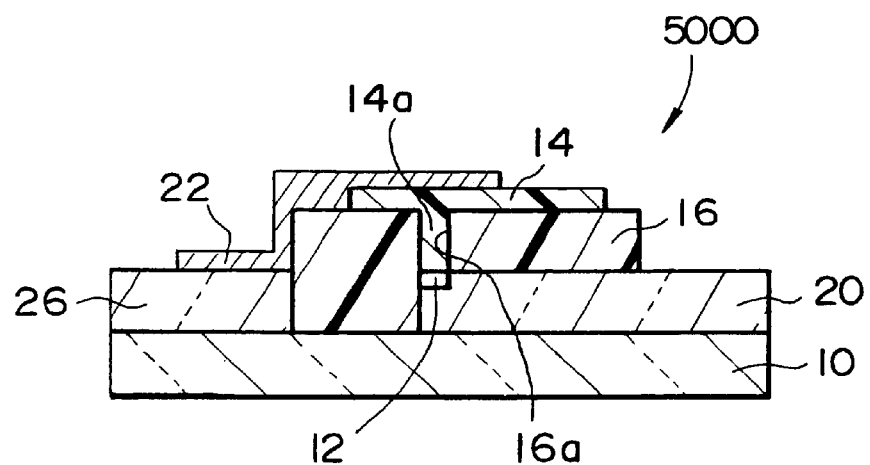
FIG. 20 is a cross-sectional view along the line X—X shown in FIG. 19.

FIG. 19 is a plan view schematically showing a light-emitting device 5000 according to the present embodiment. FIG. 20 is a cross-sectional view along the line X—X shown in FIG. 19. FIG. 19 shows a substrate 10, anode 20, electrode drawing sections 24 and 26, and grating 12 shown in FIG. 20. In FIG. 19, the light-emitting layer 14 and cathode 22 are omitted.

The light-emitting device 5000 differs from the light-emitting device 1000 according to the first embodiment in the structure of the grating and the anode. Sections having substantially the same functions as those in the light-emitting device 1000 are represented using the same symbols. In the following description, only major features of the light-emitting device 5000 differing from those of the light-emitting device 1000 will be described. The light-emitting device 5000 has a substrate 10, a light-emitting device section 100, and a waveguide section 200 which are formed on the substrate 10.

In the light-emitting device section 100, an anode 20 which forms at least part of the light-transmitting section, a grating 12, a light-emitting layer 14, and a cathode 22 are disposed on the substrate 10 in that order. An insulation layer 16 which functions as a cladding layer and a current concentrating layer is formed on the exposed area of the grating 12. The insulation layer 16 has an opening 16a extending in the periodic direction of the grating 12. The anode 20 and the cathode 22 are disposed in the area where the opening 16a is formed with the grating 12 and the light-emitting layer 14 interposed therebetween. The insulation layer 16 is also interposed between the anode 20 and the cathode 22 in the area where the opening 16a is not formed.

The grating 12 is formed in the upper area of the anode 20 and has the same width as that of the core layer 30 in the waveguide section 200 as described later. One medium layer of the grating 12 is formed using the material for the anode 20, and the other medium layer is formed using the material for the light-emitting layer 14.

The waveguide section 200 has a core layer 30 and a cladding layer 32, which covers the exposed area of the core layer 30, disposed on the substrate 10. The first electrode drawing section 24 and the second electrode drawing section 26 are disposed, one on either side of the waveguide section 200.

The anode 20 in the light-emitting device section 100 is formed using an optically transparent conductive material and forms at least part of the light-transmitting section. The anode 20 and the core layer 30 of the waveguide section 200 are integrally formed. The insulation layer (cladding Layer) 16 in the light-emitting device section 100 and the cladding layer 32 in the waveguide section 200 are integrally formed.

The feature of the present embodiment is a small area S of the anode 20 where the insulation layer is superposed. This is apparent from the comparison with FIG. 6A which shows the manufacturing method of the light-emitting device 1000 according to the first embodiment. If the area S of the anode 20 where the insulation layer is superposed is small in this manner, the area of the capacitor formed by the anode 20, insulation layer 16, and cathode 22 becomes small, thereby decreasing the capacitance thereof.

Therefore, the light-emitting device 5000 is suitably used in devices for which the effect of the capacitor parasitically formed is required to be small. For example, the light-emitting device 5000 can control the delay effect of the capacitor in communications devices using a high frequency,.

Other configurations and effects of the light-emitting device 5000 are the same as those of the light-emitting devices according to the first and other embodiments. Therefore, further description will be omitted.

Sixth Embodiment

Figure 21:
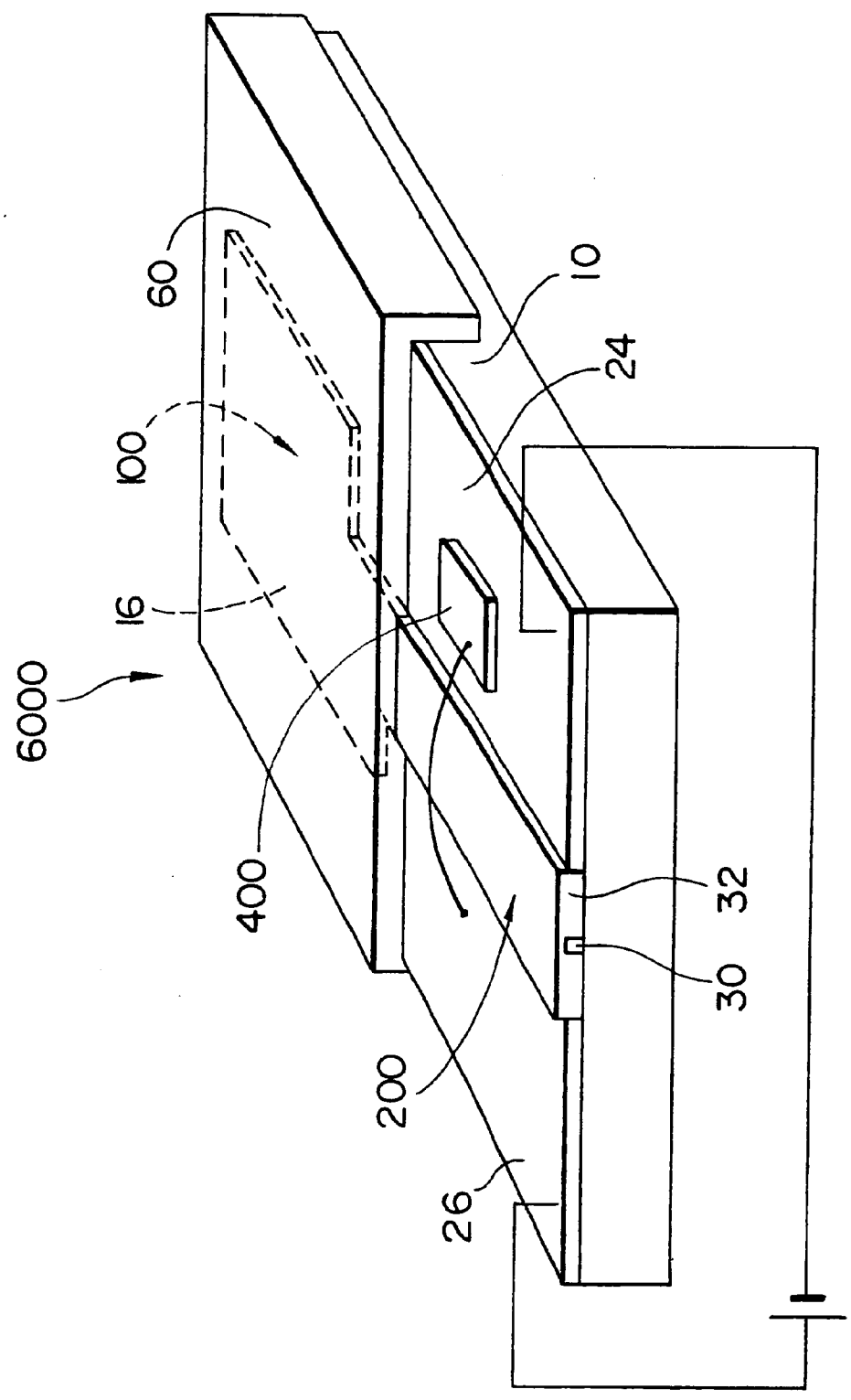
FIG. 21 is a perspective view schematically showing a light-emitting device according to a sixth embodiment of the present invention.

FIG. 21 is a perspective view schematically showing a light-emitting device 6000 according to the present embodiment. FIG. 21 is a view corresponding to FIG. 1 showing the first embodiment.

The light-emitting device 6000 differs from the light-emitting devices according to the first embodiment and other embodiments in the structure of the electrode drawing section. Sections having substantially the same functions as those in the light-emitting device 1000 are represented using the same symbols. In the following description, only major features of the light-emitting device 6000 differing from those of the light-emitting device 1000 will be described.

The light-emitting device 6000 has a substrate 10, a light-emitting device section 100, and a waveguide section 200 which are formed on the substrate 10.

The waveguide section 200 has a core layer 30 and a cladding layer 32, which covers the exposed area of the core layer 30, disposed on the substrate 10. A first electrode drawing section 24 and a second electrode drawing section 26 are disposed, one on either side of the waveguide section 200. The feature of the present embodiment is that an electronic device such as an IC driver is mounted on at least one of the first electrode drawing section 24 and second electrode drawing section 26. Specifically, the exposed area of the electrode can be used as a surface on which to mount electronic devices. FIG. 21 schematically shows a state in which an electronic device 400 is mounted on the first electrode drawing section 24. The electrode drawing section may be patterned to form wiring with a predetermined pattern, as required (not shown in FIG. 21).

According to the light-emitting device 6000, highly integrated devices can be formed by using the exposed area of the electrode as the surface on which to mount an electronic device.

What is claimed is:

1. A light-emitting device comprising a substrate and a light-emitting device section,
   wherein the light-emitting device section includes:
   a light-emitting layer capable of emitting light by electroluminescence;
   a pair of electrode layers for applying an electric field to the light-emitting layer;
   a light-transmitting section for transmitting light emitted from the light-emitting layer;
   an insulation layer disposed between the electrode layers, having an opening formed in a part of the insulation layer, and functioning as a current concentrating layer for specifying a region-through which current supplied to the light-emitting layer flows through a layer in the opening; and
   a grating for light transmitting through the light-transmitting section.

2. The light-emitting device according to claim 1, further comprising a waveguide section integrally formed with the light-emitting device section,
   wherein the waveguide section includes;
   a core layer which is optically continuous with at least part of the light-transmitting section; and
   a cladding layer which is optically continuous with the insulation layer.

3. A light-emitting device comprising a light-emitting device section and a waveguide section which transmits light emitted from the light-emitting device section, the light-emitting device section and the waveguide section being integrally formed on a substrate,
   wherein the light-emitting device section includes:
   a light-emitting layer capable of emitting light by electroluminescence;
   a pair of electrode layers for applying an electric field to the light-emitting layer;
   a light-transmitting section for transmitting light emitted from the light-emitting layer;
   an insulation layer which is disposed to be in contact with the light-transmitting section and is capable of functioning as a cladding layer; and
   a grating for light transmitting through the light-transmitting section, and
   wherein the waveguide section includes:
   a core layer integrally formed with at least part of the light-transmitting section; and
   a cladding layer integrally formed with the insulation layer.

4. The light-emitting device according to claim 3,
   wherein at least part of the light-emitting layer is formed in the opening formed in the insulation layer.

5. The light-emitting device according to claim 1, wherein the opening of the insulation layer is slit extending in the periodic direction of the grating.

6. The light-emitting device according to claim 1, wherein at least part of the light-emitting layer is formed in the opening formed in the insulation layer.

7. The light-emitting device according to claim 2, wherein one of the electrode layers is formed of a transparent conductive material, and is capable of functioning as the core layer and part of the light-transmitting section.

8. The light-emitting device according to claim 2, wherein the core layer is continuous with at least a region where the grating is formed.

9. The light-emitting device according to claim 1, wherein the grating is formed in the light-transmitting section.

10. The light-emitting device according to claim 1, wherein at least the light-emitting device section is covered with a protective layer.

11. The light-emitting device according to claim 2, wherein the waveguide section further comprises an electrode drawing section on the surface thereof.

12. The light-emitting device according to claim 11,
   wherein the electrode drawing section comprises first and second electrode drawing sections to be an anode and a cathode, the first electrode drawing section and the second electrode drawing section being formed of the same material as one of the electrode layers.

13. The light-emitting device according to claim 1,
   wherein the light-emitting device section comprises:
   a transparent anode which is formed on the substrate and is capable of functioning as at least part of the light-transmitting section,
   a grating formed in part of the anode;
   an insulation layer having an opening facing the grating,
   a light-emitting layer, at least part of the light-emitting layer being formed in the opening of the insulation layer; and
   a cathode.

14. The light-emitting device according to claim 1,
   wherein the light-emitting device section comprises:
   a grating formed in part of the substrate;
   a transparent anode which is formed on the grating and is capable of functioning as at least part of the light-transmitting section;
   an insulation layer having an opening facing the anode;
   a light-emitting layer, at least part of the light-emitting layer being formed in the opening of the insulation layer; and
   a cathode.

15. The light-emitting device according to claim 13, further comprising a waveguide section which is integrally formed with the light-emitting device section and transmits light emitted from the light-emitting device section, where the waveguide section includes:
- a core layer which is formed on the substrate and is optically continuous with the anode; and a cladding layer which covers an exposed area of the core layer and is optically continuous with the insulation layer.

16. The light-emitting device according to claim 1, wherein the light-emitting device section comprises:
- a grating substrate disposed on the substrate, a grating being formed in part of the grating substrate;
- a transparent anode which is formed on the grating of the grating substrate and is capable of functioning as at least part of the light-transmitting section;
- an insulation layer having an opening facing the anode;
- a light-emitting layer, at least part of the light-emitting layer being formed in the opening of the insulation layer; and
- a cathode.

17. The light-emitting device according to claim 16, further comprising a waveguide section which is integrally formed with the light-emitting device section and transmits light emitted from the light-emitting device section, wherein the waveguide section includes:
- a core layer which is formed on the grating substrate and is optically continuous with the anode; and
- a cladding layer which covers an exposed area of the core layer and is optically continuous with the insulation layer.

18. The light-emitting device according to claim 2, wherein the waveguide section comprises an optical fiber receiving section on which an optical fiber is capable of being placed and positioned.

19. The light-emitting device according to claim 18, further comprising the optical fiber of which end is installed in the optical fiber receiving section.

20. The light-emitting device according to claim 1, wherein at least one of the electrode layers is connected to part of the grating, and capacitance is controlled by specifying an area where the insulation layer is superposed on the electrode layer.

21. The light-emitting device according to claim 1, further comprising a surface on which an electronic device is mounted.

22. The light-emitting device according to claim 1, wherein the grating is a distributed feedback type grating.

23. The light-emitting device according to claim 22, wherein the grating has a $\lambda/4$ phase shifted structure.

24. The light-emitting device according to claim 22, wherein the grating has a gain-coupled structure.

25. The light-emitting device according to claim 1, wherein the grating is a distributed-Bragg-reflection-type grating.

26. The light-emitting device according to claim 1, where the light-emitting layer comprises an organic light-emitting material as a light-emitting material.

* * * * *